(12) United States Patent
Zou et al.

(10) Patent No.: US 10,748,465 B2
(45) Date of Patent: Aug. 18, 2020

(54) GATE DRIVE CIRCUIT, DISPLAY DEVICE AND METHOD FOR DRIVING GATE DRIVE CIRCUIT

(71) Applicants: Hefei Xinsheng Optoelectronics Technology Co., Ltd., Anhui (CN); BOE Technology Group Co., Ltd., Beijing (CN)

(72) Inventors: Yifeng Zou, Beijing (CN); Yongxian Xie, Beijing (CN); Xiong Xiong, Beijing (CN)

(73) Assignees: Hefei Xinsheng Optoelectronics Technology Co., Ltd., Hefei, Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/385,189

(22) Filed: Apr. 16, 2019

(65) Prior Publication Data

US 2020/0035138 A1 Jan. 30, 2020

(30) Foreign Application Priority Data

Jul. 25, 2018 (CN) .......................... 2018 1 0829023

(51) Int. Cl.
*G09G 3/20* (2006.01)
*G11C 19/28* (2006.01)

(52) U.S. Cl.
CPC ............. *G09G 3/20* (2013.01); *G11C 19/287* (2013.01); *G09G 2300/0426* (2013.01); *G09G 2310/0286* (2013.01); *G09G 2310/08* (2013.01)

(58) Field of Classification Search
CPC ............. G09G 3/20; G09G 2300/0426; G09G 2310/0286; G09G 2310/08; G11C 19/287
See application file for complete search history.

(56) References Cited

U.S. PATENT DOCUMENTS 10,049,609 B2 8/2018 Wang
10,223,957 B2 * 3/2019 Baek .................... G09G 3/2092
(Continued)

FOREIGN PATENT DOCUMENTS

CN 1595796 A 3/2005
CN 101290409 A 10/2008
(Continued)

OTHER PUBLICATIONS

Jun. 23, 2020 (CN) Office Action application 201810829023.1 with English Translation.

*Primary Examiner* — Sejoon Ahn
(74) *Attorney, Agent, or Firm* — Banner & Witcoff, Ltd.

(57) ABSTRACT

A gate drive circuit, a display device and a driving method are provided. The gate drive circuit includes a scan signal generation circuit and output control circuits in N stages. The scan signal generation circuit includes first output terminals in 2N stages, and is configured to output scan pulse signals in an order at the first output terminals in 2N stages; each of the output control circuits in N stages includes an input terminal, a first control terminal, a second control terminal, a second output terminal, and a bootstrap circuit, and is configured to control the bootstrap circuit, under control of a first control signal received by the first control terminal, an input signal received by the input terminal, and a second control signal received by the second control terminal, to output an output pulse signal with different pulse levels at the second output terminal.

19 Claims, 12 Drawing Sheets

(56) References Cited

U.S. PATENT DOCUMENTS

| | | | | |
|---|---|---|---|---|
| 10,223,958 B2* | 3/2019 | Lee | .................... | G02F 1/13624 |
| 10,223,959 B2* | 3/2019 | Aurongzeb | .......... | G09G 3/2096 |
| 10,223,960 B2* | 3/2019 | Inoue | ................... | G09G 3/3275 |
| 2005/0040889 A1 | 2/2005 | Tsuchi | | |
| 2008/0259010 A1 | 10/2008 | Ma | | |
| 2017/0076683 A1 | 3/2017 | Lee et al. | | |
| 2019/0304393 A1 | 10/2019 | Wang et al. | | |

FOREIGN PATENT DOCUMENTS

| | | | |
|---|---|---|---|
| CN | 105469738 A | 4/2016 | |
| CN | 107689205 A | 2/2018 | |
| CN | 108182905 A | 6/2018 | |

\* cited by examiner

GATE DRIVE CIRCUIT, DISPLAY DEVICE AND METHOD FOR DRIVING GATE DRIVE CIRCUIT

The present application claims priority of Chinese Patent Application No. 201810829023.1, filed on Jul. 25, 2018, the disclosure of which is incorporated herein by reference in its entirety as part of the present application.

TECHNICAL FIELD

Embodiments of the present disclosure relate to a gate drive circuit, a display device and a method for driving the gate drive circuit.

BACKGROUND

In fields of display technologies, for example, a pixel array of a liquid crystal display panel generally includes a plurality of rows of gate lines and a plurality of columns of data lines crossed with the gate lines. The gate lines can be driven by a bonded integrated driving circuit. In recent years, with the continuous improvement of preparation processes of amorphous silicon thin film transistors or oxide thin film transistors, a gate line driving circuit can be directly integrated on a thin film transistor array substrate to form a GOA (Gate driver On Array) to drive the gate lines. For example, a GOA including a plurality of cascaded shift register units can be used to provide on-off state voltage signals (scan signals) for the plurality of rows of gate lines of a pixel array, so as to control, for example, the plurality of rows of gate lines to be turned on sequentially, and at the same time, data signals are provided by data lines to pixel units in a corresponding row of the pixel array to form gray voltages required by respective gray scales of a display image in respective pixel units, thereby displaying one frame of image. Nowadays, more and more display panels use GOA technologies to drive the gate lines. The GOA technologies contribute to achieve a narrow frame design of the display panels and can reduce production costs of the display panels.

SUMMARY

At least one embodiment of the present disclosure provides a gate drive circuit, comprising a scan signal generation circuit and output control circuits in N stages. The scan signal generation circuit includes first output terminals in 2N stages, and is configured to output scan pulse signals in an order at the first output terminals in 2N stages; each of the output control circuits in N stages includes an input terminal, a first control terminal, a second control terminal, a second output terminal, and a bootstrap circuit connected to the input terminal and the second output terminal, and is configured to control the bootstrap circuit, under control of a first control signal received by the first control terminal, an input signal received by the input terminal, and a second control signal received by the second control terminal, to output an output pulse signal with different pulse levels at the second output terminal; a first control terminal of an m-th stage output control circuit of the output control circuits in N stages is connected to a (2m−1)-th stage first output terminal of the first output terminals in 2N stages to receive a scan pulse signal of the (2m−1)-th stage first output terminal as the first control signal, an input terminal of the m-th stage output control circuit is connected to a 2m-th stage first output terminal of the first output terminals in 2N stages to receive a scan pulse signal of the 2m-th stage first output terminal as the input signal, and a second control terminal of the m-th stage output control circuit is connected to a (2m+1)-th stage first output terminal of the first output terminals in 2N stages to receive a scan pulse signal of the (2m+1)-th stage first output terminal as the second control signal; and N is an integer greater than 2, and m is an integer greater than or equal to 1 and less than N.

For example, in the gate drive circuit provided by an embodiment of the present disclosure, each of the output control circuits in N stages further includes a third control terminal and is further configured to control the bootstrap circuit under control of a third control signal received by the third control terminal. A third control terminal of the m-th stage output control circuit is connected to a (2m+i)-th stage first output terminal of the first output terminals in 2N stages to receive a scan pulse signal of the (2m+i)-th stage first output terminal as the third control signal; and i is an integer greater than 2.

For example, in the gate drive circuit provided by an embodiment of the present disclosure, a pulse of the scan pulse signal output from the (2m+1)-th stage first output terminal is temporally continuous with a pulse of the scan pulse signal output from the (2m+i)-th stage first output terminal.

For example, in the gate drive circuit provided by an embodiment of the present disclosure, each of the output control circuits in N stages further includes a first output control sub-circuit, a second output control sub-circuit and a third output control sub-circuit. The first output control sub-circuit is connected to the first control terminal, a first voltage terminal and the second output terminal, and is configured to control the bootstrap circuit under control of the first control signal received by the first control terminal; the second output control sub-circuit is connected to the second control terminal, the first voltage terminal and the second output terminal, and is configured to control the bootstrap circuit under control of the second control signal received by the second control terminal; and the third output control sub-circuit is connected to the third control terminal, a second voltage terminal and the second output terminal, and is configured to control the bootstrap circuit under control of the third control signal received by the third control terminal.

For example, in the gate drive circuit provided by an embodiment of the present disclosure, the first output control sub-circuit includes a first transistor, the second output control sub-circuit includes a second transistor and the third output control sub-circuit includes a third transistor. A gate electrode of the first transistor is connected to the first control terminal to receive the first control signal, a first electrode of the first transistor is connected to the first voltage terminal to receive a first voltage, and a second electrode of the first transistor is connected to the second output terminal; a gate electrode of the second transistor is connected to the second control terminal to receive the second control signal, a first electrode of the second transistor is connected to the first voltage terminal to receive the first voltage, and a second electrode of the second transistor is connected to the second output terminal; and a gate electrode of the third transistor is connected to the third control terminal to receive the third control signal, a first electrode of the third transistor is connected to the second voltage terminal to receive a second voltage, and a second electrode of the third transistor is connected to the second output terminal.

For example, in the gate drive circuit provided by an embodiment of the present disclosure, a type of the first transistor is identical to a type of the second transistor.

For example, in the gate drive circuit provided by an embodiment of the present disclosure, each of the output control circuits in N stages further includes a first output control sub-circuit and a second output control sub-circuit. The first output control sub-circuit is connected to the first control terminal, a first voltage terminal and the second output terminal, and is configured to control the bootstrap circuit under control of the first control signal received by the first control terminal; and the second output control sub-circuit is connected to the second control terminal, the first voltage terminal, and the second output terminal, and is configured to control the bootstrap circuit under control of the second control signal received by the second control terminal.

For example, in the gate drive circuit provided by an embodiment of the present disclosure, each of the output control circuits in N stages further includes a third output control sub-circuit; and the third output control sub-circuit is connected to the second control terminal, a second voltage terminal and the second output terminal, and is configured to control the bootstrap circuit under control of the second control signal received by the second control terminal.

For example, in the gate drive circuit provided by an embodiment of the present disclosure, the first output control sub-circuit includes a first transistor, the second output control sub-circuit includes a second transistor, and the third output control sub-circuit includes a third transistor. A gate electrode of the first transistor is connected to the first control terminal to receive the first control signal, a first electrode of the first transistor is connected to the first voltage terminal to receive a first voltage, and a second electrode of the first transistor is connected to the second output terminal; a gate electrode of the second transistor is connected to the second control terminal to receive the second control signal, a first electrode of the second transistor is connected to the first voltage terminal to receive the first voltage, and a second electrode of the second transistor is connected to the second output terminal; a gate electrode of the third transistor is connected to the second control terminal to receive the second control signal, a first electrode of the third transistor is connected to the second voltage terminal to receive a second voltage, and a second electrode of the third transistor is connected to the second output terminal; and a type of the second transistor is different from a type of the third transistor.

For example, in the gate drive circuit provided by an embodiment of the present disclosure, the first output control sub-circuit includes a first transistor, the second output control sub-circuit includes a second transistor, and the third output control sub-circuit includes a third transistor and an inverter. A gate electrode of the first transistor is connected to the first control terminal to receive the first control signal, a first electrode of the first transistor is connected to the first voltage terminal to receive a first voltage, and a second electrode of the first transistor is connected to the second output terminal; a gate electrode of the second transistor is connected to the second control terminal to receive the second control signal, a first electrode of the second transistor is connected to the first voltage terminal to receive the first voltage, and a second electrode of the second transistor is connected to the second output terminal; a gate electrode of the third transistor is connected to the inverter, a first electrode of the third transistor is connected to the second voltage terminal to receive a second voltage, and a second electrode of the third transistor is connected to the second output terminal; the inverter is connected to the second control terminal and the gate electrode of the third transistor, and is configured to invert and output a level of the second control signal received by the second control terminal to the gate electrode of the third transistor; and a type of the second transistor is identical to a type of the third transistor.

For example, in the gate drive circuit provided by an embodiment of the present disclosure, the bootstrap circuit includes a first capacitor. A first electrode of the first capacitor is connected to the input terminal to receive the input signal, and a second electrode of the first capacitor is connected to the second output terminal.

For example, in the gate drive circuit provided by an embodiment of the present disclosure, the scan signal generation circuit includes 2N cascaded shift register units, each of the 2N cascaded shift register units includes one of the first output terminals in 2N stages.

For example, in the gate drive circuit provided by an embodiment of the present disclosure, each of the 2N cascaded shift register units is a shift register unit of a GOA type.

For example, the gate drive circuit provided by an embodiment of the present disclosure further includes a first voltage line and a second voltage line. The first voltage line is connected to the first voltage terminal and is configured to provide a first voltage; and the second voltage line is connected to the second voltage terminal and is configured to provide a second voltage.

At least one embodiment of the present disclosure also provides a display device, which includes the gate drive circuit provided by any one of embodiments of the present disclosure.

At least one embodiment of the present disclosure also provides a method for driving the gate drive circuit, which includes: in a first phase, the scan pulse signal of the (2m−1)-th stage first output terminal being at a pulse level, and a pulse level of the output pulse signal output by the second output terminal of the m-th stage output control circuit being a second level; in a second phase, the scan pulse signal of the (2m−1)-th stage first output terminal and the scan pulse signal of the 2m-th stage first output terminal being at a pulse level, and the pulse level of the output pulse signal output by the second output terminal of the m-th stage output control circuit being a first level; in a third phase, the scan pulse signal of the 2m-th stage first output terminal and the scan pulse signal of the (2m+1)-th stage first output terminal being at a pulse level, and the pulse level of the output pulse signal output by the second output terminal of the m-th stage output control circuit being the first level; in a fourth phase, the scan pulse signal of the 2m-th stage first output terminal being at a horizontal level, the scan pulse signal of the (2m+1)-th stage first output terminal being at a pulse level, and the pulse level of the output pulse signal output by the second output terminal of the m-th stage output control circuit being the second level; and in a fifth phase, the scan pulse signal of the (2m+1)-th stage first output terminal being a horizontal level, and the pulse level of the output pulse signal output by the second output terminal of the m-th stage output control circuit being a third level.

For example, in the driving method provided by an embodiment of the present disclosure, the first level is greater than the second level.

For example, in the driving method provided by an embodiment of the present disclosure, the second level is greater than the third level.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1A:
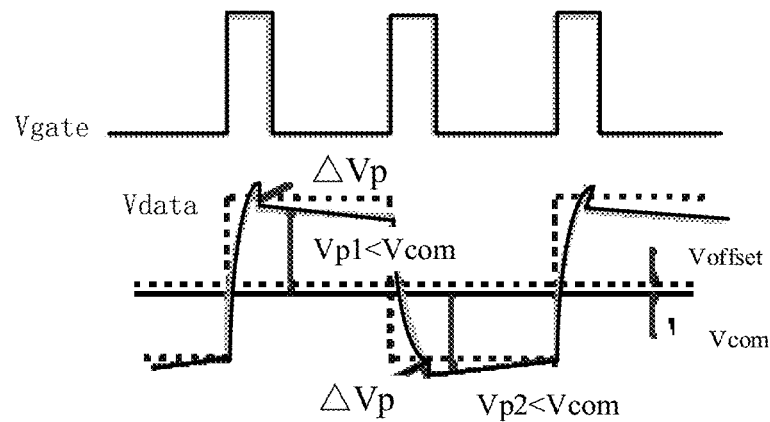
FIG. 1A is a schematic diagram of a waveform of a data signal pulled by a gate signal.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below by way of a few specific embodiments. In order to keep the following description of embodiments of the present disclosure clear and concise, detailed descriptions of known functions and known components have been omitted. When any one of components of an embodiment of the present disclosure appears in more than one of drawings, the components are denoted by identical reference numerals in each of the drawings.

In current display technologies, pixels in each row can be controlled independently by a gate drive circuit. Due to influences of structures and fabrication processes of the gate drive circuit, a parasitic capacitance is inevitably generated, which causes a signal (for example, a data signal Vdata) applied to a pixel electrode to be easily affected by a gate scan signal to occur a pulling phenomenon. FIG. 1A is a schematic diagram of a waveform of a data signal pulled by a gate scan signal. As shown in FIG. 1A, when a gate scan signal Vgate changes (for example, a level of the gate scan signal Vgate changes from high to low or from low to high), a pull voltage $\Delta Vp$ will be generated for a data signal Vdata. Because a display image is controlled by a data voltage applied to a pixel electrode, the pulling of the data signal can directly cause a change in the display image (e.g., display brightness), for example, generating undesirable phenomena such as afterimage, flicker and the like, which seriously affect display quality and user's visual experiences.

Figure 1B:
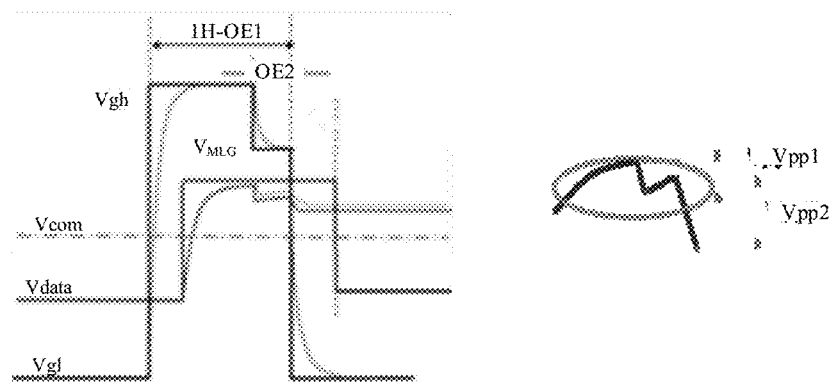
FIG. 1B is a schematic diagram of a waveform after chamfering a gate signal.

For example, when an integrated circuit driving chip (G-IC) is used to drive a display panel, the G-IC usually performs chamfering control on the gate scan signal output by the G-IC to reduce a pulling effect of the change in the gate scan signal on the data signals applied to the pixel electrodes. FIG. 1B is a schematic diagram of a waveform after chamfering the gate scan signal. For example, before performing the chamfering process, $\Delta Vp$ may be expressed as:

$$\Delta Vp = Cgs/(CLC + Cst + Cgs) * (Vgh - Vgl)$$

where Cgs, Cst and Clc represent parasitic capacitances. For example, Cgs may represent a parasitic capacitance formed between a gate electrode or a source electrode of a driving transistor in a pixel circuit and data lines or gate lines, Cst may represent a parasitic capacitance formed between a storage capacitance in the pixel circuit and the data lines or the gate lines, Clc may represent a parasitic capacitance formed between a display electrode/a common electrode in the pixel circuit and the data lines or the gate lines.

For example, as shown in FIG. 1B, after performing the chamfering process, ΔVp may include ΔVpp1 and ΔVpp2, and ΔVpp1 and ΔVpp2 may be respectively expressed as:

$$\Delta Vpp1 = Cgs/(CLC+Cst+Cgs)*(Vgh-V_{MLG})$$

$$\Delta Vpp2 = Cgs/(CLC+Cst+Cgs)*(V_{MLG}-Vgl)$$

As can be seen from FIG. 1B and the above formulas, because VMLG-Vgl is larger than Vgh-VMLG and ΔVp is mainly related to ΔVpp2, therefore, the pulling voltage ΔVp of the data signal pulled by the gate scan signal is reduced to a certain extent, thereby achieving chamfering. However, GOA units can only shift and output clock signals at present, and cannot achieve the above-mentioned chamfering function, therefore application and promotion of the GOA units are severely limited.

An embodiment of the present disclosure provides a gate drive circuit including a scan signal generation circuit and output control circuits in N stages. The scan signal generation circuit includes first output terminals in 2N stages, and is configured to output scan pulse signals in a predetermined order at the first output terminals in 2N stages; each of the output control circuits in N stages includes an input terminal, a first control terminal, a second control terminal, a second output terminal, and a bootstrap circuit connected to the input terminal and the second output terminal, and is configured to control the bootstrap circuit, under control of a first control signal received by the first control terminal, an input signal received by the input terminal, and a second control signal received by the second control terminal, to output an output pulse signal with different pulse levels at the second output terminal; a first control terminal of an m-th stage output control circuit of the output control circuits in N stages is connected to a (2m−1)-th stage first output terminal of the first output terminals in 2N stages to receive a scan pulse signal of the (2m−1)-th stage first output terminal as the first control signal, an input terminal of the m-th stage output control circuit is connected to a 2m-th stage first output terminal of the first output terminals in 2N stages to receive a scan pulse signal of the 2m-th stage first output terminal as the input signal, and a second control terminal of the m-th stage output control circuit is connected to a (2m+1)-th stage first output terminal of the first output terminals in 2N stages to receive a scan pulse signal of the (2m+1)-th stage first output terminal as the second control signal; and N is an integer greater than 2, and m is an integer greater than or equal to 1 and less than N. An embodiment of the present disclosure also provides a display device and a driving method corresponding to the above-described gate drive circuit.

For the gate drive circuit, the display device and the driving method provided by the above embodiments of the present disclosure, on one hand, the gate drive circuit can automatically chamfer a gate scan signal output by the gate drive circuit to weaken the pulling effect of the change of the gate scan signal on the data signal, thereby weakening the phenomena, such as flicker, afterimage and the like, of the display panel when displaying pictures, and improving the display quality of the display panel; and on other hand, the gate drive circuit can adopt a relatively low working voltage to maintain a stability of characteristics of transistors and prolong a service life of the display panel.

Embodiments of the present disclosure and examples thereof will be described in detail below with reference to accompanying drawings.

Figure 2A:
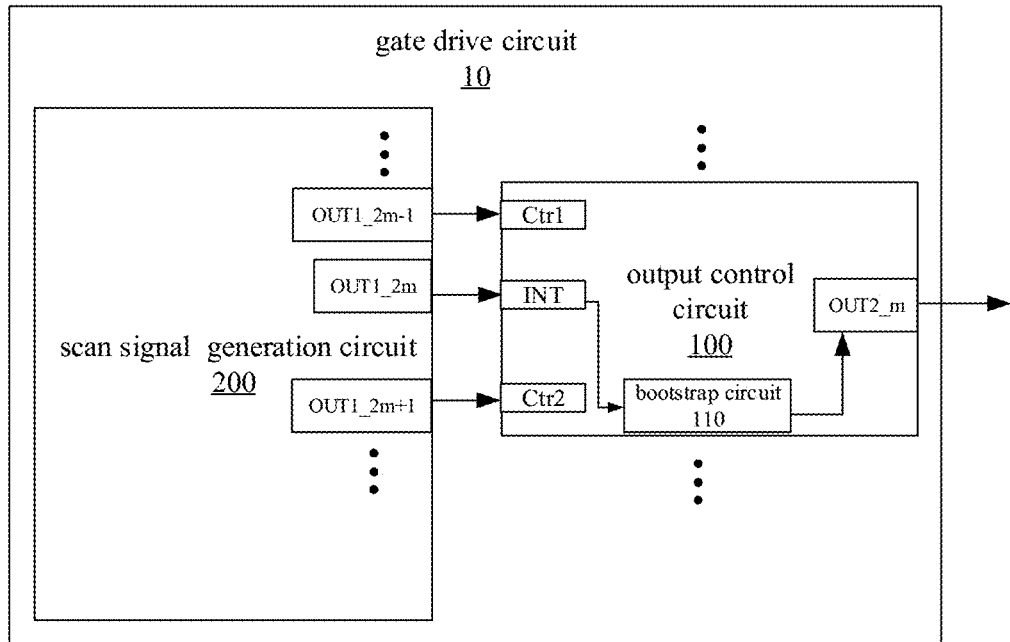
FIG. 2A is a schematic diagram of a gate drive circuit provided by at least one embodiment of the present disclosure.
Figure 2B:
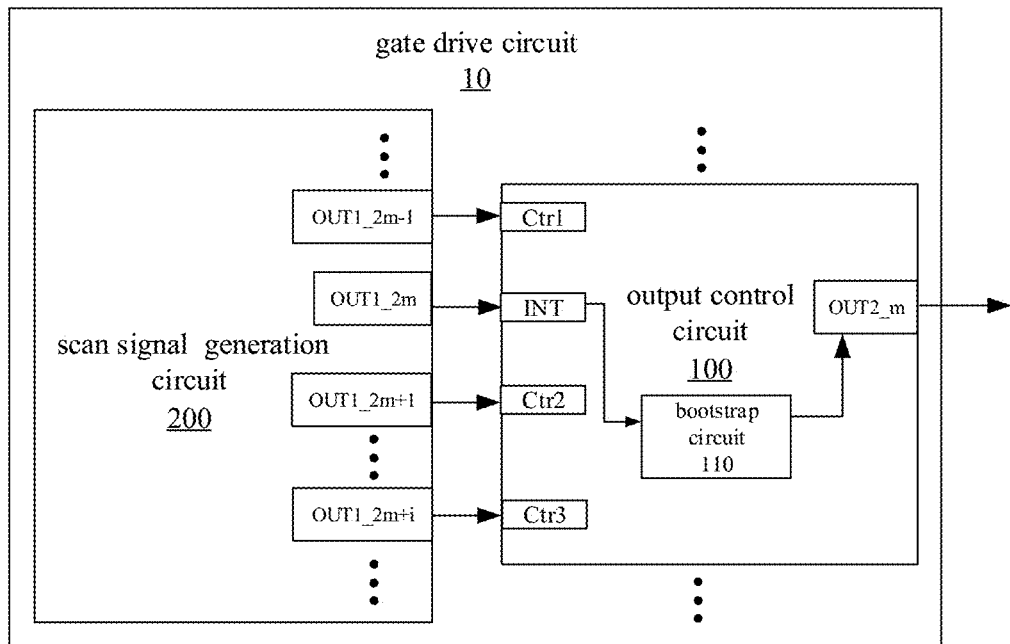
FIG. 2B is a schematic diagram of another gate drive circuit provided by at least one embodiment of the present disclosure.

FIG. 2A is a schematic diagram of a gate drive circuit provided by at least one embodiment of the disclosure, and FIG. 2B is a schematic diagram of another gate drive circuit provided by at least one embodiment of the disclosure. As shown in FIG. 2A, the gate drive circuit 10 includes output control circuits 100 in N stages and a scan signal generation circuit 200. It should be noted that the gate drive circuit 10 may include output control circuits 100 in N (N is an integer greater than 2) stages, but FIG. 2A only exemplarily shows one output control circuit 100.

For example, the scan signal generation circuit 200 may be a plurality of cascaded shift register units or an integrated circuit driving chip, and the embodiments of the present disclosure are not limited thereto.

For example, as shown in FIG. 2A, the scan signal generation circuit 200 includes first output terminals OUT1 in 2N stages (N is an integer greater than 2), and is configured to output scan pulse signals in a predetermined order at the first output terminals in 2N stages in a predetermined period. For example, the predetermined period may be set to correspond to a scan period of progressive scan, i.e., a scan period of one frame of display image, and for example, the scan period includes the time when scan pulse signals are sequentially output from a first stage first output terminal to a 2N-th stage first output terminal; and the predetermined period may also be set to correspond to a scan period of interlaced scan, for example, for first output terminals in odd-numbered stages, the predetermined period may include the time when scan pulse signals are sequentially output from the first stage first output terminal to a (2N−1)-th stage first output terminal, or for first output terminals in even-numbered stages, the predetermined period may include the time that scan pulse signals are sequentially output from a second stage first output terminal to the 2N-th stage first output terminal.

For example, in an example, the scan signal generation circuit 200 includes 2N cascaded shift register units, and the 2N cascaded shift register units are in one-to-one correspondence with the first output terminals OUT1 in 2N stages, i.e., each of the 2N cascaded shift register units includes one of the first output terminals OUT1 in 2N stages. For example, each of the 2N cascaded shift register units is a shift register unit of a GOA (Gate driver On Array) type, the GOA type represents a technology that a gate driver circuit chip (gate driver ICs) including a plurality of shift register units is directly fabricated on an array substrate instead of a technology of fabricating the gate driver circuit by an external silicon wafer. In the example, the output control circuits 100 in N stages and the scan signal generation circuit 200 are all prepared on an array substrate of the display panel, thereby facilitating to enable the display panel to have advantages such as a narrow frame, a thin thickness, reduced assembly costs, and the like. In another example, the scan signal generation circuit 200 is an integrated circuit driving chip, which may be connected to the array substrate in a binding manner by, for example, a flexible printed circuit board (FPC), and the scan signal generation circuit 200 can be further integrated into the integrated circuit driving chip, or be prepared on the array substrate and then be electrically connected with the integrated circuit driving chip.

As shown in FIG. 2A, each of output control circuits 100 in N stages (for example, FIG. 2A takes an m-th (m is an integer greater than or equal to 1 and less than n) stage output control circuit 100 as an example, it should be noted that a structure of the m-th stage output control circuit as shown in FIG. 2A can be applied to each of the output control circuits 100 in N stages, as long as connection relationships of a first control terminal, a second control terminal, and an input terminal, etc. are adjusted accordingly) includes an input terminal INT, a first control terminal Ctr1, a second control terminal Ctr2, a second output terminal OUT2_m, and a bootstrap circuit 110 connected to the input terminal INT and the second output terminal OUT2_m, and is configured to control the bootstrap circuit 110 under control of a first control signal received by the first control terminal Ctr1, an input signal received by the input terminal INT, and a second control signal received by the second control terminal Ctr2, to output an output pulse signal with different pulse levels at the second output terminal OUT2_m, so as to drive, for example, a gate line connected to the second output terminal OUT2_m, and also to reduce the pulling effect of the change of the gate scan signal output by the second output terminal OUT2_m on the data signal, thereby achieving the chamfering for the data signal and improving the display quality of the display panel.

It should be noted that "output pulse signal with different pulse levels" can indicate that the output pulse signal includes at least two different pulse levels within an effective pulse width of the output pulse signal, and the "effective pulse width" represents a time width at which a transistor connected to a corresponding gate line can be controlled to be turned on by the output pulse signal.

As shown in FIG. 2A, a first control terminal Ctr1 of the m-th stage output control circuit of the output control circuits in N stages is connected to a (2m−1)-th stage first output terminal OUT1_2m−1 of the first output terminals in 2N stages to receive a scan pulse signal of the (2m−1)-th stage first output terminal OUT1_2m−1 as the first control signal, an input terminal INT of the m-th stage output control circuit is connected to a 2m-th stage first output terminal OUT1_2m of the first output terminals in 2N stages to receive a scan pulse signal of the 2m-th stage first output terminal OUT1_2m as the input signal, and a second control terminal Ctr2 of the m-th stage output control circuit is connected to a (2m+1)-th stage first output terminal OUT1_2m+1 of the first output terminals in 2N stages to receive a scan pulse signal of the (2m+1)-th stage first output terminal OUT1_2m+1 as the second control signal.

Here, first output terminals in every two stages of the scan signal generation circuit 200 corresponds to an output control circuit 100 in one stage. Therefore, in a case where the scan signal generation circuit 200 is in a progressive scan mode to output the scan pulse signals, the output control circuits 100 are also in a progressive scan mode to output the output pulse signals; and in a case where the scan signal generation circuit 200 is in an interlaced scan mode to output the scan pulse signals, the output control circuits 100 are also in an interlaced scan mode to output the output pulse signals. It should be noted that the first control signal is not limited to the scan pulse signal output by the scan signal generation circuit 200, but may also be other control signals that can implement the output control function. The embodiment of the present disclosure is not limited to this case, and the following embodiments are the same as this case described herein and will not be described again.

For the gate drive circuit provided by the embodiments of the present disclosure, on one hand, the gate drive circuit can automatically chamfer a gate scan signal output by the gate drive circuit to weaken the pulling effect of the change of the gate scan signal on the data signal, thereby weakening the phenomena, such as flicker, afterimage and the like, of the display panel when displaying pictures, and improving the display quality of the display panel; and on other hand, the gate drive circuit can adopt a relatively low working voltage to maintain a stability of characteristics of transistors and prolong a service life of the display panel.

For example, in some other embodiments of the present disclosure, as shown in FIG. 2B, each of the output control circuits 100 in N stages further includes a third control terminal Ctr3 and is further configured to control the bootstrap circuit 110 under control of a third control signal received by the third control terminal Ctr3. For example, a third control terminal of the m-th stage output control circuit 110 is connected to a (2m+i)-th (i is an integer greater than 2) stage first output terminal of the first output terminals in 2N stages to receive a scan pulse signal of the (2m+i)-th stage first output terminal as the third control signal.

For example, a pulse of the scan pulse signal output from the (2m+1)-th stage first output terminal is temporally continuous with a pulse of the scan pulse signal output from the (2m+i)-th stage first output terminal. That is, the pulse of the scan pulse signal received by the second control terminal is temporally continuous with the pulse of the scan pulse signal received by the third control terminal. For example, in a case where the pulse of the scan pulse signal of the (2m+1)-th stage first output terminal changes from a high level to a low level, the pulse of the scan pulse signal of the (2m+i)-th stage first output terminal changes from a low level to a high level; or in a case where the pulse of the scan pulse signal of the (2m+1)-th stage first output terminal changes from a low level to a high level, the pulse of the scan pulse signal of the (2m+i)-th stage first output terminal changes from a high level to a low level. The following embodiments are the same as those described herein and will not be described again.

In the following, the specific structure of the output control circuit will be described in detail by taking the m-th stage output control circuit 100 as an example. The output control circuits other than the m-th stage output control circuit 100 in the gate drive circuit are similar to the m-th stage output control circuit 100. The following embodiments are the same as this case described herein and will not be described in detail.

Figure 3A:
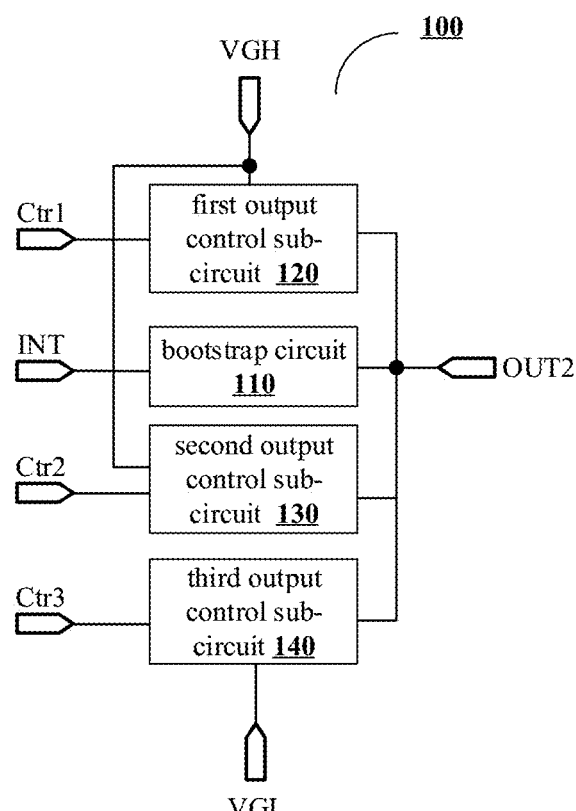
FIG. 3A is a schematic diagram of an output control circuit provided by at least one embodiment of the present disclosure.

FIG. 3A is a schematic diagram of an exemplary output control circuit provided by at least one embodiment of the present disclosure. As shown in FIG. 3A, the output control circuit 100 includes a bootstrap circuit 110, a first output control sub-circuit 120, a second output control sub-circuit 130, and a third output control sub-circuit 140. For example, in the example, the output control circuit 100 further includes an input terminal INT, a first control terminal Ctr1, a second control terminal Ctr2, and a third control terminal Ctr3.

For example, the first output control sub-circuit 120 is connected to the first control terminal Ctr1, a first voltage terminal VGH and the second output terminal OUT2, and is configured to control the bootstrap circuit 110 under control of the first control signal received by the first control terminal Ctr1. For example, the first output control sub-circuit 120 is turned on in a case where the first control signal received by the first control terminal Ctr1 is at a pulse level, and connects the first voltage terminal VGH with the bootstrap circuit 110, thereby charging the bootstrap circuit 110. In a case where the first output control sub-circuit 120 is turned on, a level of the output pulse signal output at the second output terminal OUT2 includes a level of a first voltage provided by the first voltage terminal VGH.

It should be noted that when the bootstrap circuit 110 occurs a bootstrap effect, the first output control sub-circuit 120 may be turned off even if the first control signal received by the first control terminal Ctr1 is at the pulse level.

The second output control sub-circuit 130 is connected to the second control terminal Ctr2, the first voltage terminal VGH and the second output terminal OUT2, and is configured to control the bootstrap circuit 110 under control of the second control signal received by the second control terminal Ctr2. For example, the second output control sub-circuit 130 is turned on in a case where the second control signal received by the second control terminal Ctr2 is at a pulse level, and connects the first voltage terminal VGH with the bootstrap circuit 110, thereby charging the bootstrap circuit 110. In a case where the second output control sub-circuit 130 is turned on, the level of the output pulse signal output at the second output terminal OUT2 includes the level of the first voltage provided by the first voltage terminal VGH.

It should be noted that when the bootstrap circuit 110 occurs the bootstrap effect, the second output control sub-circuit 130 may be turned off even if the second control signal received by the second control terminal Ctr2 is at the pulse level.

For example, the third output control sub-circuit 140 is connected to the third control terminal Ctr3, a second voltage terminal VGL and the second output terminal OUT2, and is configured to control the bootstrap circuit 110 under control of the third control signal received by the third control terminal Ctr3. For example, the third output control sub-circuit 140 is turned on in a case where the third control signal received by the third control terminal Ctr3 is at a pulse level, and connects the second voltage terminal VGL with the bootstrap circuit 110, thereby discharging the bootstrap circuit 110. In a case where the third output control sub-circuit 140 is turned on, the level of the output pulse signal output at the second output terminal OUT2 includes a level of a second voltage provided by the second voltage terminal VGL.

For example, a pulse amplitude of the scan pulse signal is different from a pulse amplitude of the output pulse signal. The scan pulse signal includes a pulse level and a horizontal level, and the pulse level is greater than the horizontal level. The pulse amplitude of the scan pulse signal may represent a voltage difference between the pulse level and the horizontal level of the scan pulse signal, and the pulse amplitude of the scan pulse signal is, for example, a pulse amplitude of a clock signal, for example, 3.3 volts (V). The output pulse signal may include a first pulse level, a second pulse level and a horizontal level, the first pulse level is greater than the second pulse level, and the second pulse level is greater than the horizontal level. The pulse amplitude of the output pulse signal may include a first sub-pulse amplitude and a second sub-pulse amplitude. The first sub-pulse amplitude is a voltage difference between the first pulse level and the horizontal level of the output pulse signal, and the second sub-pulse amplitude is a voltage difference between the second pulse level and the horizontal level of the output pulse signal. The first sub-pulse amplitude of the output pulse signal is, for example, VGH−VGL+VCLK, the second sub-pulse amplitude is, for example, VGH−VGL, VGH represents the first voltage, VGL represents the second voltage, and VCLK represents the clock signal. Therefore, under the control of the first output control sub-circuit 120, the second output control sub-circuit 130, the third output control sub-circuit 140 and the bootstrap circuit 110, the output pulse signal with different pulse levels can be output, so the pulling effect of the change of the output gate scan signal on the data signal can be weakened, the chamfering for the data signal can be achieved, and the display quality of the display panel can be improved.

For example, within the effective pulse width, the output pulse signal includes the first pulse level and the second pulse level.

It should be noted that the pulse level of the scan pulse signal is, for example, a high level, the horizontal level of the scan pulse signal is, for example, a low level, the first pulse level and the second pulse level of the output pulse signal may be, for example, both high levels, and the horizontal level of the output pulse signal is, for example, a low level, the setting of the output pulse signal and the scan pulse signal may be determined according to specific actual conditions, and the embodiments of the present disclosure are not limited to this case. The embodiments of the present disclosure are described by taking the pulse level being a high level and the horizontal level being a low level as examples. The following embodiments are the same as the above description and will not be described again.

It should be noted that the first voltage terminal VGH may be configured, for example, to continue to input a DC high level signal, and for example, the DC high level signal is referred to as the first voltage, and for example, is a dozen volts or tens of volts. For example, the second voltage terminal VGL may be configured, for example, to continue to input a DC low level signal. For example, the DC low level signal is referred to as the second voltage, and the second voltage is lower than the first voltage. The following embodiments are the same as the above description and will not be described again.

Figure 3B:
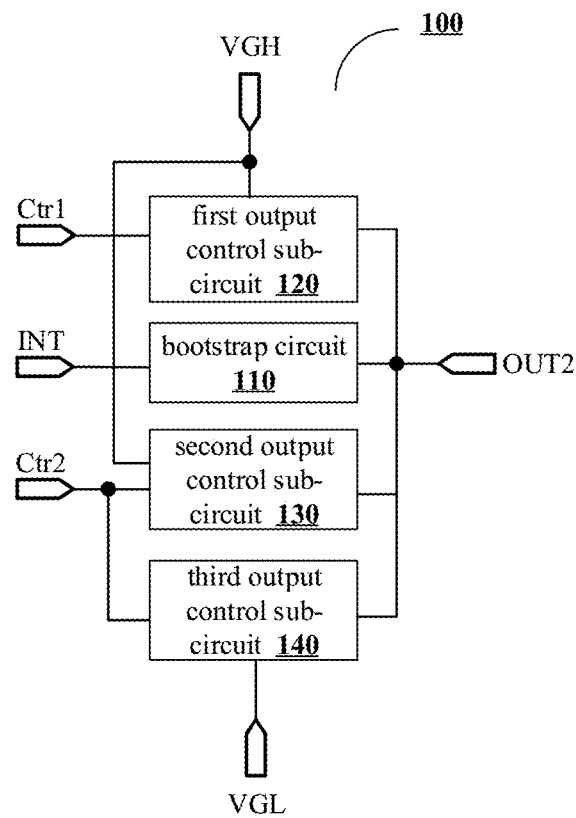
FIG. 3B is a schematic diagram of another output control circuit provided by at least one embodiment of the present disclosure.

For example, FIG. 3B shows a schematic diagram of an output control circuit of another example of the present disclosure. As shown in FIG. 3B, a structure the output control circuit 100 is similar to the structure of the output control circuit as shown in FIG. 3A, but differences between the output control circuit 100 as shown in FIG. 3B and the output control circuit 100 as shown in FIG. 3A include that: the output control circuit 100 as shown in FIG. 3B includes an input terminal INT, a first control terminal Ctr1, and a second control terminal Ctr2, and the second output control sub-circuit 130 and the third output control sub-circuit 140 are both connected to the second control terminal Ctr2. For example, the output control circuit 100 as shown in FIG. 3B differs from the output control circuit as shown in FIG. 3A only in that: in the output control circuit 100 as shown in FIG. 3B, the third output control sub-circuit 140 is connected to the second control terminal Ctr2, and in the output control circuit 100 as shown in FIG. 3A, the third output control sub-circuit 140 is connected to the third control terminal Ctr3.

For example, as shown in FIG. 3B, the third output control sub-circuit 140 is connected to the second control terminal Ctr2, the second voltage terminal VGL, and the second output terminal OUT2, and is configured to control the bootstrap circuit 110 under the control of the second control signal received by the second control terminal Ctr2.

For example, the second output control sub-circuit 130 is turned on in a case where the second control signal received by the second control terminal Ctr2 is at a pulse level, and connects the first voltage terminal VGH with the bootstrap circuit 110 to charge the bootstrap circuit 110. At this time, the level of the output pulse signal at the second output terminal OUT2 of the output control circuit 100 includes the level of the first voltage provided by the first voltage terminal VGH. The third output control sub-circuit 140 is turned on in a case where the second control signal received by the second control terminal Ctr2 is at a horizontal level, and connects the second voltage terminal VGL with the bootstrap circuit 110, thereby discharging the bootstrap circuit 110. At this time, the level of the output pulse signal at the second output terminal OUT2 of the output control circuit 100 includes the level of the second voltage provided by the second voltage terminal VGL.

For example, in some examples, the function of controlling the third output control sub-circuit 140 through the second control signal provided by the second control terminal Ctr2 may be implemented by connecting an inverter between the second control terminal Ctr2 and the third output control sub-circuit 140. In other examples, in a case where the second output control sub-circuit 130 and the third output control sub-circuit 140 are both implemented as transistors, the function may be implemented by adopting different types of transistors in the second output control sub-circuit 130 and the third output control sub-circuit 140. For example, an N-type transistor is used in the second output control sub-circuit 130, and a P-type transistor is used in the third output control sub-circuit 140, or a P-type transistor is used in the second output control sub-circuit 130, and an N-type transistor is used in the third output control sub-circuit 140.

It should be noted that the implementations of the second output control sub-circuit 130 and the third output control sub-circuit 140 may be determined on specific circumstances, and the embodiments of the present disclosure are not limited to these case here.

For example, the second output control sub-circuit 130 and the third output control sub-circuit 140 can operate alternately, the second output control sub-circuit 130 operates in response to a pulse level of the received scan pulse signal (i.e., the second control signal), and the third output control sub-circuit 140 operates in response to a horizontal level of the received scan pulse signal (i.e., the second control signal).

It should be noted that in other embodiments, the second output control sub-circuit 130 may be turned on in a case where the second control signal is at a horizontal level, and correspondingly, the third output control sub-circuit 140 may be turned on in a case where the second control signal is at a pulse level. The embodiments of the present disclosure are not limited to these case here.

Figure 4A:
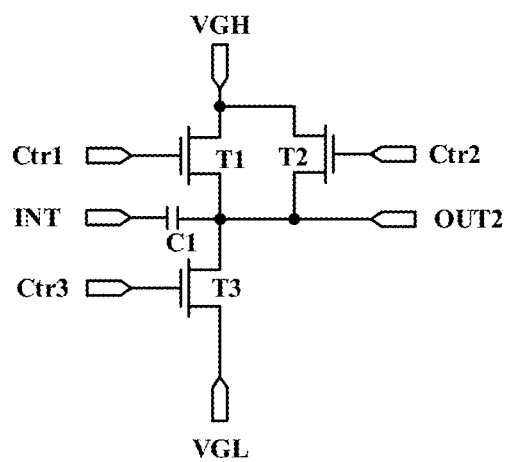
FIG. 4A is a circuit schematic diagram of a specific implementation example of the output control circuit as shown in FIG. 3A.

For example, the output control circuit 100 as shown in FIG. 3A may be specifically implemented as a circuit structure as shown in FIG. 4A in an example.

As shown in FIG. 4A, the first output control sub-circuit 120 may be implemented as a first transistor T1. As shown in FIG. 4A, a gate electrode of the first transistor T1 is connected to the first control terminal Ctr1 to receive the first control signal, a first electrode of the first transistor T1 is connected to the first voltage terminal VGH to receive a first voltage, and a second electrode of the first transistor T1 is connected to the second output terminal OUT2. The first control signal can control the first transistor T1 to be turned on or turned off. For example, in a case where the first control signal is at a pulse level, the first transistor T1 is turned on; in a case where the first control signal is at a horizontal level, the first transistor T1 is turned off.

As shown in FIG. 4A, the second output control sub-circuit 130 may be implemented as a second transistor T2. As shown in FIG. 4A, a gate electrode of the second transistor T2 is connected to the second control terminal Ctr2 to receive the second control signal, a first electrode of the second transistor T2 is connected to the first voltage terminal VGH to receive the first voltage, and a second electrode of the second transistor T2 is connected to the second output terminal OUT2 and also connected to the second electrode of the first transistor T1. The second control signal can control the second transistor T2 to be turned on or turned off. For example, in a case where the second control signal is at a pulse level, the second transistor T2 is turned on; in a case where the second control signal is at a horizontal level, the second transistor T2 is turned off.

For example, a type of the first transistor T1 is identical to a type the second transistor T2.

For example, in some embodiments, in a case where the output control circuit 100 includes the third output control sub-circuit 140 and the third control terminal Ctr3, as shown in FIG. 4A, the third output control sub-circuit 140 may be implemented as a third transistor T3. As shown in FIG. 4A, a gate electrode of the third transistor T3 is connected to the third control terminal Ctr3 to receive the third control signal, a first electrode of the third transistor T3 is connected to the second voltage terminal VGL to receive a second voltage, and a second electrode of the third transistor T3 is connected to the second output terminal OUT2 and also connected to the second electrode of the first transistor T1 and the second electrode of the second transistor T2. The third control signal can control the third transistor T3 to be turned on or turned off. For example, in a case where the third control signal is at a pulse level, the third transistor T3 is turned on; in a case where the third control signal is at a horizontal level, the third transistor T3 is turned off.

For example, as shown in FIG. 4A, the bootstrap circuit 110 may be implemented as a first capacitor C1. A first electrode of the first capacitor C1 is connected to the input terminal INT to receive the input signal, a second electrode of the first capacitor C1 is connected to the second output terminal OUT2, and is also connected to the second electrode of the first transistor T1, the second electrode of the second transistor T2, and the second electrode of the third transistor T3. According to characteristics that a voltage across the capacitor cannot suddenly change, a voltage of the second electrode of the first capacitor C1 changes according to a voltage of the input terminal INT, a voltage of the second electrode of the first transistor T1, a voltage of the second electrode of the second transistor T2 and a voltage of the second electrode of the third transistor T3, so as to achieve to output the output pulse signal with different pulse levels at the second output terminal OUT2, thereby weakening the pulling effect of the output gate scan signal on the data signal, achieving the chamfering for the data signal and improving the display quality of the display panel.

For example, in the example as shown in FIG. 4A, the first transistor T1 to the third transistor T3 are all illustrated by taking a case that the first transistor T1 to the third transistor T3 are N-type transistors as an example, but the embodiment of the present disclosure is not limited to this case, and at least part of the first transistor T1 to the third transistor T3 may be implemented as P-type transistors as required.

Figure 4B:
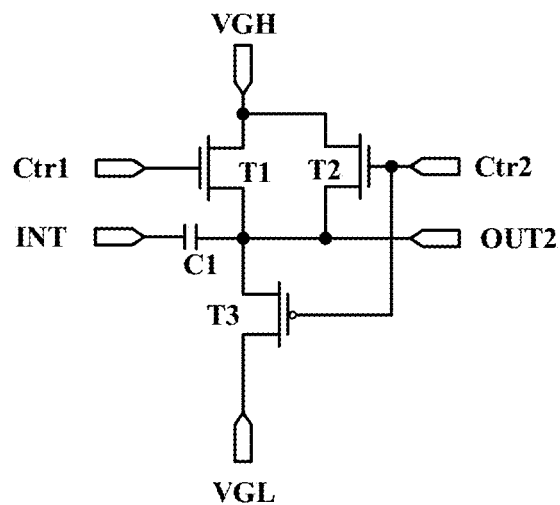
FIG. 4B is a circuit schematic diagram of a specific implementation example of the output control circuit as shown in FIG. 3B.

For example, the output control circuit 100 as shown in FIG. 3B may be specifically implemented as a circuit structure as shown in FIG. 4B in an example. The circuit structure of the output control circuit as shown in FIG. 4B is similar to the circuit structure of the output control circuit as shown in FIG. 4A, except for the implementation of the third output control sub-circuit 140.

As shown in FIG. 4B, the third output control sub-circuit 140 may be implemented as a third transistor T3. A gate electrode of the third transistor T3 is connected to the second control terminal Ctr2 to receive a second control signal, a first electrode of the third transistor T3 is connected to the second voltage terminal VGL to receive a second voltage, and a second electrode of the third transistor T3 is connected to the second output terminal OUT2.

For example, in the example shown in FIG. 4B, a type of the second transistor T2 is different from a type of the third transistor T3. For example, the second transistor T2 may be an N-type transistor, and the third transistor T3 may be a P-type transistor. For example, the second transistor T2 is turned on in a case where the scan pulse signal is at a pulse level to connect the first voltage terminal VGH with the second electrode of the first capacitor C1 and the second output terminal OUT2; and the third transistor T3 is turned on in a case where the scan pulse signal is at a horizontal level to connect the second voltage terminal VGL with the second electrode of the first capacitor C1 and the second output terminal OUT2.

Figure 4C:
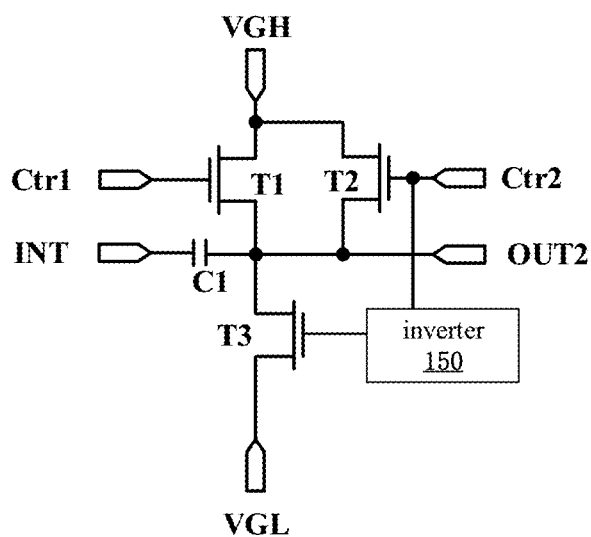
FIG. 4C is a circuit schematic diagram of another specific implementation example of the output control circuit as shown in FIG. 3B.

For example, the output control circuit 100 shown in FIG. 3B may also be specifically implemented as a circuit structure as shown in FIG. 4C in another example. As shown in FIG. 4C, a structure of the output control circuit 100 is similar to a structure of the output control circuit 100 as shown in FIG. 4B, but the difference is that: the third output control sub-circuit 140 as shown in FIG. 4C may further include an inverter 150.

For example, as shown in FIG. 4C, the third output control sub-circuit 140 may be implemented as a third transistor T3 and an inverter 150. For example, a gate electrode of the third transistor T3 is connected to the inverter 150, a first electrode of the third transistor T3 is connected to the second voltage terminal VGL to receive a second voltage, and a second electrode of the third transistor T3 is connected to the second output terminal OUT2. For example, the inverter 150 is connected to the second control terminal Ctr2 and the gate electrode of the third transistor T3, and is configured to invert a level of the second control signal received by the second control terminal Ctr2 and output the inverted second control signal to the gate electrode of the third transistor T3. For example, an input terminal of the inverter 150 is connected to the second control terminal Ctr2, and an output terminal of the inverter 150 is connected to the gate electrode of the third transistor T3.

For example, in the example shown in FIG. 4C, a type of the second transistor is identical to a type of the third transistor T3. For example, the second transistor T2 and the third transistor T3 are both N-type transistors. It should be noted that the inverter 150 can be any circuit structure that can achieve a function of an inverter, and will not be described in detail here.

For example, in the embodiment of the present disclosure, the scan signal generation circuit 200 may include 2N cascaded shift register units 200. For example, the shift register unit 200 may be a shift register unit of a GOA type. The embodiment of the present disclosure does not limit a specific structure of the shift register unit of the GOA type, and may adopt any circuit structure capable of implementing a function of the shift register unit. For example, the shift register unit of the GOA type may include an input circuit, a first pull-up node, and an output circuit. The input circuit controls a level of the first pull-up node, and the first pull-up node controls the output circuit to output a corresponding pulse signal.

Figure 5A:
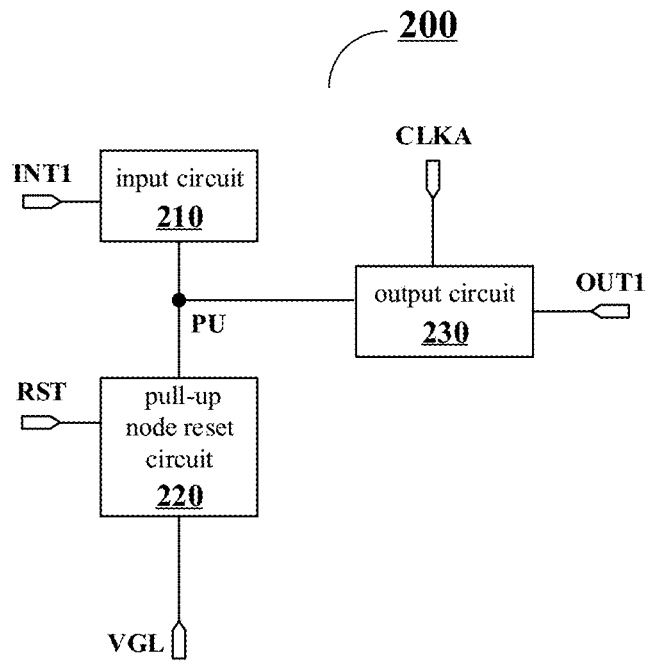
FIG. 5A is a schematic diagram of a shift register unit provided by at least one embodiment of the present disclosure.

For example, FIG. 5A is a schematic diagram of a shift register unit 200 provided by an embodiment of the present disclosure. As shown in FIG. 5A, the shift register unit 200 includes an input circuit 210, a pull-up node reset circuit 220, and an output circuit 230.

The input circuit 210 is configured to charge the pull-up node PU in response to an input signal. For example, the input circuit 210 may be connected to a shift input terminal INT1 and a pull-up node PU, and be configured to electrically connect the pull-up node PU with the shift input terminal INT1 or a high voltage terminal provided separately under the control of a signal input from the shift input terminal INT1, so that the pull-up node PU may be charged by a high level signal input from the shift input terminal INT1 or a high level signal output from the high voltage terminal to increase a voltage at the pull-up node PU to control the output circuit 230 to be turned on.

The pull-up node reset circuit 220 is configured to reset the pull-up node PU in response to a reset signal. For example, the pull-up node reset circuit 220 may be configured to be connected to a reset terminal RST, therefore, under the control of the reset signal input from the reset terminal RST, the pull-up node PU may be electrically connected to a low level signal or a low voltage terminal, the low voltage terminal may be, for example, the second voltage terminal VGL, so that the pull-up node PU may be pulled-down to achieve reset.

The output circuit 230 is configured to output a first clock signal input from a first clock signal terminal CLKA to a first output terminal OUT1, as a scan pulse signal output by the shift register unit 200, under the control of a level of the pull-up node PU, and the scan pulse signal can be output to a corresponding output control circuit 100. For example, the output circuit 230 may be configured to be turned on under the control of the level of the pull-up node PU to electrically connect the first clock signal terminal CLKA and the first output terminal OUT1, so that the first clock signal input from the first clock signal terminal CLKA may be output to the first output terminal OUT1.

Figure 5B:
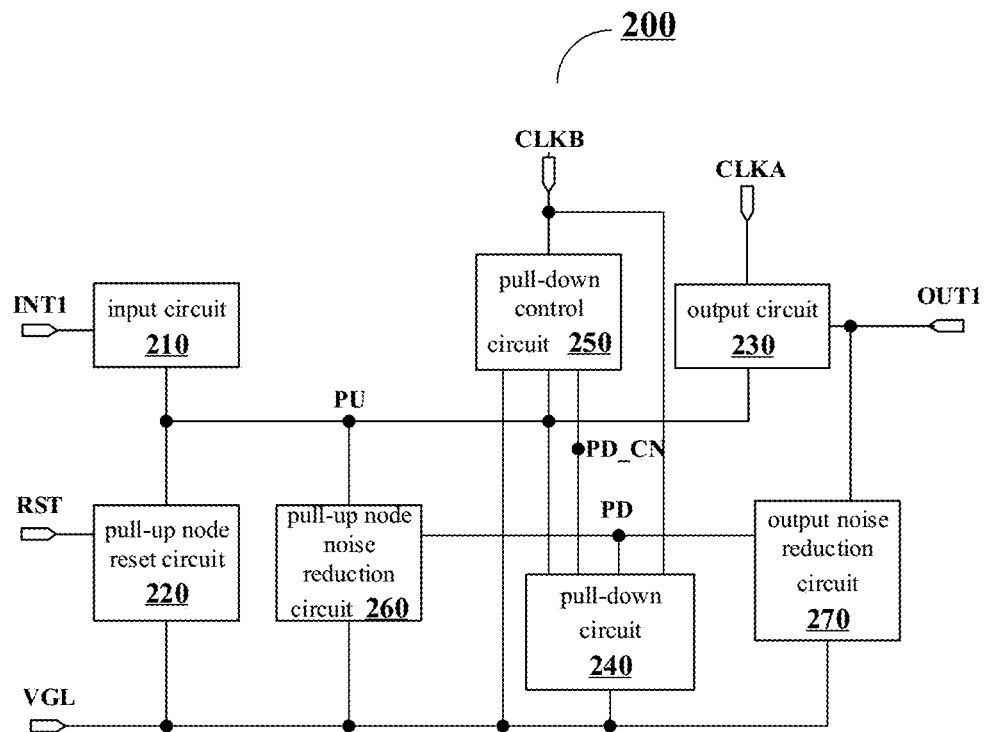
FIG. 5B is a schematic diagram of another shift register unit provided by at least one embodiment of the present disclosure.

For example, as shown in FIG. 5B, in another example of the embodiment of the present disclosure, the shift register unit 200 may further include a pull-down circuit 240, a pull-down control circuit 250, a pull-up node noise reduction circuit 260, and an output noise reduction circuit 270.

The pull-down circuit 240 is configured to control a level of a pull-down node PD under the control of the level of the pull-up node PU and a level of a pull-down control node PD_CN, and further control the pull-up node noise reduction circuit 260 and the output noise reduction circuit 270.

For example, the pull-down circuit 240 may be connected to a second clock signal terminal CLKB, the second voltage terminal VGL, the pull-up node PU, the pull-down node PD, and the pull-down control node PD_CN to electrically connect the pull-down node PD with the second voltage terminal VGL under the control of the level of the pull-up node PU, so as to control the level of the pull-down node PD to be pulled-down to a low potential. Meanwhile, the pull-down circuit 240 can electrically connect the pull-down node PD with the second clock signal terminal CLKB under the control of the level of the pull-down control node PD_CN, thereby charging the pull-down node PD by using the second clock signal of the second clock signal terminal CLKB and keeping the pull-down node PD to be at a high potential. For example, by reducing an operating voltage of the pull-down circuit 240 to a logic voltage, for example, 3.3V, of the second clock signal, phenomena, that the threshold drift occurs in the transistor in the circuit due to the transistor being in a high voltage state for a long time, is avoided.

For example, in another example, the shift register unit may also adopt a DC noise reduction structure. For example, the pull-down circuit 240 may be connected to the first voltage terminal VGH, the second voltage terminal VGL, the pull-up node PU, the pull-down node PD, and the pull-down control node PD_CN to electrically connect the pull-down node PD with the second voltage terminal VGL under the control of the level of the pull-up node PU, so as to control the level of the pull-down node PD to be pulled-down to a low potential. Also, the pull-down circuit 240 can electrically connect the pull-down node PD with the first voltage terminal VGH under the control of the level of the pull-down control node PD_CN, thereby charging the pull-down node PD to be at a high potential.

The pull-down control circuit 250 is configured to control the level of the pull-down control node PD_CN under the control of the level of the pull-up node PU. For example, the pull-down control circuit 250 may be connect to the second clock signal terminal CLKB, the second voltage terminal VGL, the pull-up node PU and the pull-down control node PD_CN. Under the control of the level of the pull-up node PU, the pull-down control circuit 250 may electrically connect the pull-down control node PD_CN with the second voltage terminal VGL, thereby pulling down the pull-down control node PD_CN to a non-operating potential by the second voltage provided by the second voltage terminal VGL. For example, under the control of the second clock signal provided by the second clock signal terminal CLKB, the pull-down control circuit 250 can electrically connect the pull-down control node PD_CN with the second clock signal terminal CLKB, thereby pulling up the pull-down control node PD_CN to an operating potential through the second clock signal provided by the second clock signal terminal CLKB. By reducing the operating voltage of the pull-down control circuit 250 to a logic voltage, for example, 3.3V, of the second clock signal, the phenomena, that the threshold drift occurs in the transistor in the circuit due to the transistor being in a high voltage state for a long time, is avoided.

For example, in another example, the pull-down control circuit 250 may be connected to the first voltage terminal VGH, the second voltage terminal VGL, the pull-up node PU, and the pull-down control node PD_CN. Under the control of the level of the pull-up node PU, the pull-down control circuit 250 can electrically connect the pull-down control node PD_CN with the second voltage terminal VGL, thereby pulling down the pull-down control node PD_CN to a non-operating potential. For example, under the control of the first voltage provided by the first voltage terminal VGH, the pull-down control circuit 250 may electrically connect the pull-down control node PD_CN with the first voltage terminal VGH, thereby pulling up the pull-down control node PD_CN to an operating potential through the first voltage provided by the first voltage terminal VGH.

The pull-up node noise reduction circuit 260 is configured to perform noise reduction on the pull-up node PU under the control of the level of the pull-down node PD. For example, the pull-up node noise reduction circuit 260 may be configured to be connected to the second voltage terminal VGL, so as to electrically connect the pull-up node PU with the second voltage terminal VGL under the control of the level of the pull-down node PD, thereby performing pull-down and noise reduction on the pull-up node PU.

The output noise reduction circuit 270 is configured to perform noise reduction on the first output terminal OUT1 under the control of the level of the pull-down node PD. For example, the output noise reduction circuit 270 may be configured to electrically connect the first output terminal OUT1 with the second voltage terminal VGL under the control of the level of the pull-down node PD, thereby performing pull-down and noise reduction on the first output terminal OUT1.

It should be noted that the shift register unit 200 is not limited to the structures shown in FIG. 5A and FIG. 5B, the shift register unit may also be other shift register units of various types, and the embodiment of the present disclosure is not limited to this case.

Figure 6:
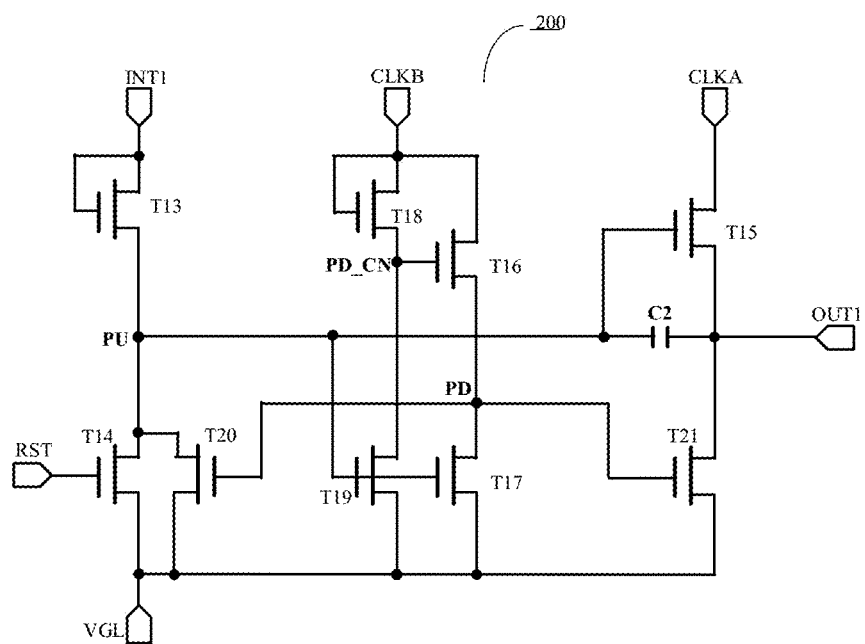
FIG. 6 is a circuit schematic diagram of the shift register unit as shown in FIG. 5B.

For example, the shift register unit 200 shown in FIG. 5B may be specifically implemented as a circuit structure shown in FIG. 6 in an example. In the following description, the embodiments are described by taking a case that each transistor in the shift register unit 200 is an N-type transistor as an example, but the embodiments of the present disclosure are not limited to this case.

For example, as shown in FIG. 6, the input circuit 210 may include a thirteenth transistor T13. A gate electrode and a first electrode of the thirteenth transistor T13 are electrically connected to each other and are both configured to be connected to the shift input terminal INT1 to receive a shift input signal, and a second electrode of the thirteenth transistor T13 is configured to be connected to the pull-up node PU, so that in a case where the thirteenth transistor T13 is turned on under the control of a turned-on signal (e.g., a shift input signal with a high level) received by the shift input terminal INT1, the turned-on signal is used to charge the pull-up node PU, so as to make the pull-up node PU be at a high level.

For example, as shown in FIG. 6, the pull-up node reset circuit 220 may include a fourteenth transistor T14. A gate electrode of the fourteenth transistor T14 is configured to be connected to the reset terminal RST to receive the reset signal, a first electrode of the fourteenth transistor T14 is configured to be connected to the pull-up node PU, and a second electrode of the fourteenth transistor T14 is configured to be connected to the second voltage terminal VGL to receive the second voltage. In a case where the fourteenth transistor T14 is turned on under the control of the reset signal, the pull-up node PU is electrically connected to the second voltage terminal VGL, so that the pull-up node PU can be reset and be reduced from a high level to a low level.

For example, as shown in FIG. 6, the output circuit 230 may include a fifteenth transistor T15 and a second capacitor C2. A gate electrode of the fifteenth transistor T15 is configured to be connected to the pull-up node PU, a first electrode of the fifteenth transistor T15 is configured to be connected to the first clock signal terminal CLKA to receive the first clock signal, and a second electrode of the fifteenth transistor T15 is configured to be connected to the first output terminal OUT1; and a first electrode of the second capacitor C2 is configured to be connected to the gate electrode of the fifteenth transistor T15, and a second electrode of the second capacitor C2 is connected to the second electrode of the fifteenth transistor T15.

For example, as shown in FIG. 6, the pull-down circuit 240 may include a sixteenth transistor T16 and a seventeenth transistor T17. For example, as shown in FIG. 6, in an example, a gate electrode of the sixteenth transistor T16 is configured to be connected to the pull-down control node PD_CN, a first electrode of the sixteenth transistor T16 is configured to be connected to the second clock signal terminal CLKB to receive the second clock signal, and a second electrode of the sixteenth transistor T16 is configured to be connected to the pull-down node PD. For example, in another example, the gate electrode of the sixteenth transistor T16 is configured to be connected to the pull-down control node PD_CN, the first electrode of the sixteenth transistor T16 is configured to be connected to the first voltage terminal VGH to receive the first voltage, and the second electrode of the sixteenth transistor T16 is configured to be connected to the pull-down node PD.

For example, a gate electrode of the seventeenth transistor T17 is configured to be connected to the pull-up node PU, a first electrode of the seventeenth transistor T17 is configured to be connected to the pull-down node PD, and a second electrode of the seventeenth transistor T17 is configured to be connected to the second voltage terminal VGL to receive the second voltage.

For example, as shown in FIG. 6, the pull-down control circuit 250 may include an eighteenth transistor T18 and a nineteenth transistor T19. For example, as shown in FIG. 6, in an example, a gate electrode and a first electrode of the eighteenth transistor T18 are electrically connected to each other and are both configured to be connected to the second clock signal terminal CLKB to receive the second clock signal, and a second electrode of the eighteenth transistor T18 is configured to be connected to the pull-down control node PD_CN. For example, in another example, the gate electrode and the first electrode of the eighteenth transistor T18 are electrically connected to each other and are both configured to be connected to the first voltage terminal VGH to receive the first voltage, and the second electrode of the eighteenth transistor T18 is configured to be connected to the pull-down control node PD_CN.

For example, a gate electrode of the nineteenth transistor T19 is configured to be connected to the pull-up node PU, a first electrode of the nineteenth transistor T19 is configured to be connected to the pull-down control node PD_CN, and a second electrode of the nineteenth transistor T19 is configured to be connected to the second voltage terminal VGL to receive the second voltage.

For example, as shown in FIG. 6, the pull-up node noise reduction circuit 260 may include a twentieth transistor T20. A gate electrode of the twentieth transistor T20 is configured to be connected to the pull-down node PD, a first electrode of the twentieth transistor T20 is configured to be connected to the pull-up node PU, and a second electrode of the twentieth transistor T20 is configured to be connected to the second voltage terminal VGL to receive the second voltage. The twentieth transistor T20 is turned on in a case where the pull-down node PD is at a high potential, and connects the pull-up node PU with the second voltage terminal VGL, so that the pull-up node PU can be pulled down to achieve noise reduction.

For example, as shown in FIG. 6, the output noise reduction circuit 270 may include a twenty-first transistor T21. A gate electrode of the twenty-first transistor T21 is configured to be connected to the pull-down node PD, a first electrode of the twenty-first transistor T21 is configured to be connected to the first output terminal OUT1, and a second electrode of the twenty-first transistor T21 is configured to be connected to the second voltage terminal VGL to receive the second voltage. The twenty-first transistor T21 is turned on in a case where the pull-down node PD is at a high potential, and connects the first output terminal OUT1 with the second voltage terminal VGL, so that noise reduction can be performed on the first output terminal OUT1.

It should be noted that the transistors used in the embodiments of the present disclosure may all be thin film transistors or field effect transistors or other switching devices with the like characteristics, and the embodiments of the present disclosure can be described by taking the thin film transistors as an example. A source electrode and a drain electrode of each transistor used here can be symmetrical in structure, so the source electrode and the drain electrode of the transistor can be structurally indistinguishable. In the embodiments of the present disclosure, in order to distinguish the two electrodes of the transistor except a gate electrode, one of the two electrodes is referred to as a first electrode described directly, and the other is referred to as a second electrode.

In addition, the transistors in the embodiments of the present disclosure are all described by taking an N-type transistor as an example. In this case, a first electrode of each transistor is the drain electrode, and a second electrode of the transistor is the source electrode. It should be noted that the present disclosure includes but is not limited to this case. For example, one or more transistors in the shift register unit provided by the embodiment of the present disclosure may also adopt P-type transistors. In this case, a first electrode of each transistor is the source electrode, a second electrode of the transistor is the drain electrode, and as long as polarities of the respective electrodes of selected-type transistors correspondingly be connected in accordance with the polarities of the respective electrodes of the respective transistors in the embodiment of the present disclosure.

It should be noted that in the following description, the first electrode of the transistor is a drain electrode and the second electrode of the transistor is a source electrode.

For example, as shown in FIG. 6, the transistors in the shift register unit 200 are all N-type transistors, the first voltage terminal VGH continues to input the first voltage with a DC high level, the second voltage terminal VGL continues to input the second voltage with a DC low level, the first clock signal terminal CLKA inputs the first clock signal, and the second clock signal terminal CLKB inputs the second clock signal.

Figure 7A:
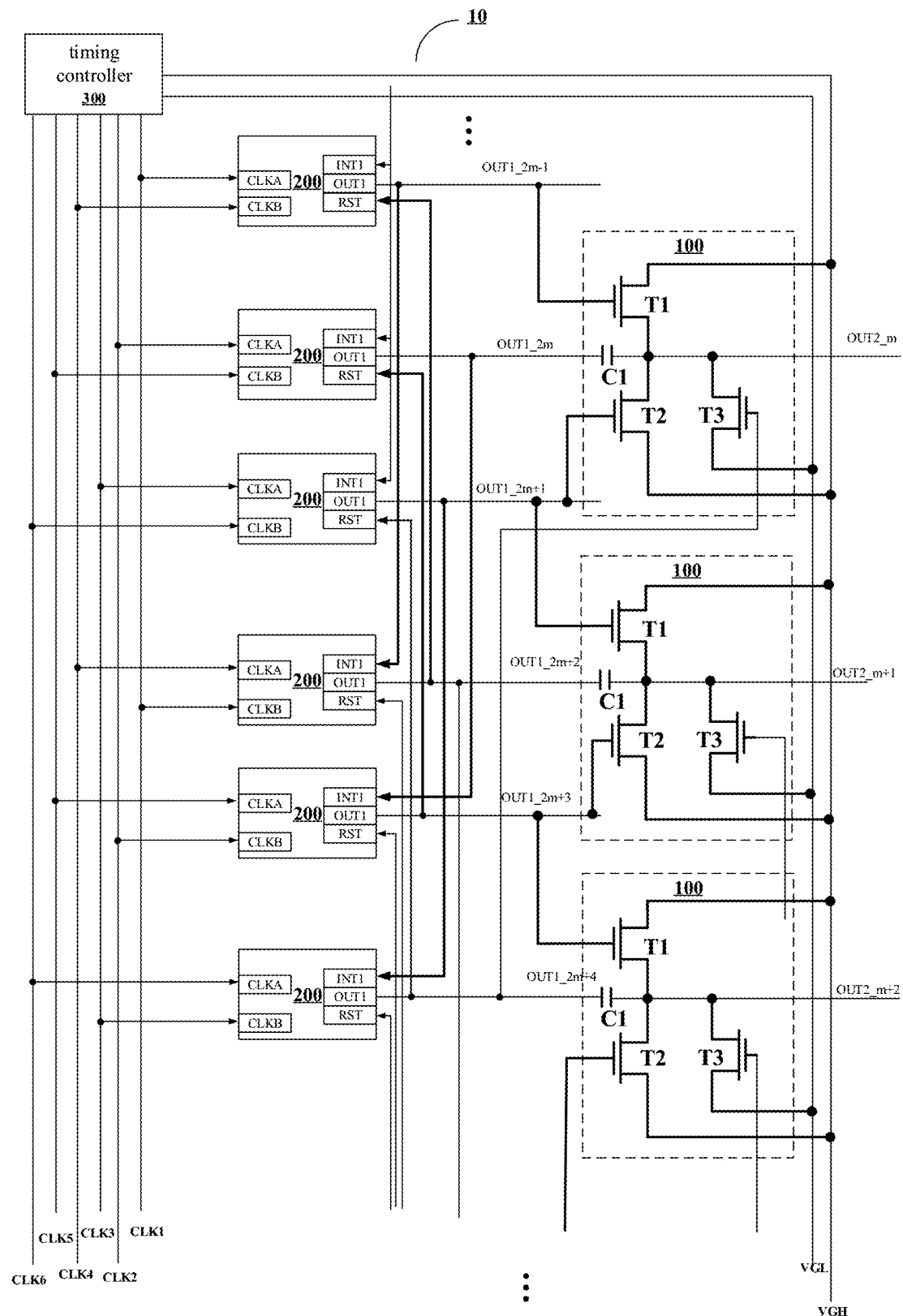
FIG. 7A is a circuit schematic diagram of a gate drive circuit provided by at least one embodiment of the present disclosure.

At least one embodiment of the present disclosure also provides a gate drive circuit. As shown in FIG. 7A, in an example, the gate drive circuit 10 includes a plurality of cascaded shift register units 200 and a plurality of output control circuits 100. For example, the output control circuit 100 in the example shown in FIG. 7A may adopt the output control circuit shown in FIG. 4A, that is, each output control circuit 100 includes the input terminal INT, the first control terminal Ctr1, the second control terminal Ctr2, and the third control terminal Ctr3. For example, the shift register unit in the example shown in FIG. 7A may be the shift register unit shown in FIG. 6, and the embodiment of the present disclosure is not limited thereto. It should be noted that the present disclosure is not limited to this case, and the output control circuit 100 may also adopt the structure shown in FIG. 4B or FIG. 4C, and details will not be repeated herein again.

For example, the plurality of shift register units 200 may include a (2m−1)-th stage shift register unit, a 2m-th stage shift register unit, and a (2m+1)-th stage shift register unit. The plurality of output control circuits 100 may include the m-th stage output control circuit 100.

As shown in FIG. 7A, the gate drive circuit 10 includes a first clock signal line CLK1, a second clock signal line CLK2, a third clock signal line CLK3, a fourth clock signal line CLK4, a fifth clock signal line CLK5, and a sixth clock signal line CLK6. For example, the input terminal INT (i.e., the first electrode of the first capacitor C1) of the m-th stage output control circuit 100 is connected to the first output terminal OUT1_2m of the 2m-th stage shift register unit, the first control terminal Ctr1 (i.e., the gate electrode of the first transistor T1) of the m-th stage output control circuit 100 is connected to the first output terminal OUT1_2m−1 of the (2m−1)-th stage shift register unit, the second control terminal Ctr2 (i.e., the gate electrode of the second transistor T2) of the m-th stage output control circuit 100 is connected to the first output terminal OUT1_2m+1 of the (2m+1)-th stage shift register unit, and the third control terminal Ctr3

(i.e., the gate electrode of the third transistor T3) of the m-th stage output control circuit 100 is connected to the first output terminal OUT1_2m+4 of a (2m+4)-th stage shift register unit. That is, in the example shown in FIG. 7A, i is equal to 4.

It should be noted that if the output control circuit shown in FIG. 4B or FIG. 4C is adopted, the gate electrode of the second transistor T2 and the gate electrode of the third transistor T3 are both connected to the first output terminal OUT1_2m+1 of the (2m+1)-th stage shift register unit.

For example, as shown in FIG. 7A, the first clock signal line CLK1 is connected to, for example, a first clock signal terminal CLKA of a (6n−5)-th (n is an integer greater than 0) stage shift register unit and a second clock signal terminal CLKB of a (6n−2)-th stage shift register unit; the second clock signal line CLK2 is connected to, for example, a first clock signal terminal CLKA of a (6n−4)-th stage shift register unit and a second clock signal terminal CLKB of a (6n−1)-th stage shift register unit; the third clock signal line CLK3 is connected to, for example, a first clock signal terminal CLKA of the (6n−3)-th stage shift register unit and a second clock signal terminal CLK2 of a 6n-th stage shift register unit; the fourth clock signal line CLK4 is connected to, for example, a first clock signal terminal CLK1 of the (6n−2)-th stage shift register unit and a second clock signal terminal CLKB of the (6n−5)-th stage shift register unit; the fifth clock signal line CLK5 is connected to, for example, a first clock signal terminal CLKA of the (6n−1)-th stage shift register unit and a second clock signal terminal CLKB of the (6n−4)-th stage shift register unit; and the sixth clock signal line CLK6 is connected to, for example, a first clock signal terminal CLKA of the 6n-th stage shift register unit and a second clock signal terminal CLKB of the (6n−3)-th stage shift register unit. It should be noted that the embodiments of the present disclosure may also include other connection methods, and the embodiments of the present disclosure are not limited thereto.

For example, pulse levels of clock signals output from the first output terminals of the respective shift register units 200 are the same. That is, a pulse level of a clock signal provided by the first clock signal line CLK1, a pulse level of a clock signal provided by the second clock signal line CLK2, a pulse level of a clock signal provided by the third clock signal line CLK3, a pulse level of a clock signal provided by the fourth clock signal line CLK4, a pulse level of a clock signal provided by the fifth clock signal line CLK5, and a pulse level of a clock signal provided by the sixth clock signal line CLK6 are the same, and for example, all are VCLK.

It should be noted that OUT1_2m−1 as shown in FIG. 7A represents the first output terminal of the (2m−1)-th stage shift register unit, OUT1_2m represents the first output terminal of the 2m-th stage shift register unit, OUT1_2m+1 represents the first output terminal of the (2m+1)-th stage shift register unit, OUT1_2m+2 represents the first output terminal of a (2m+2)-th stage shift register unit, . . . , and so on. OUT2_$m$ as shown in FIG. 7A represents the second output terminal of the m-th stage output control circuit, OUT2_$m$+1 represents the second output terminal of a (m+1)-th stage output control circuit, OUT2_$m$+2 represents the second output terminal of a (m+2)-th stage output control circuit, . . . , and so on. Reference numerals in the following embodiments are similar to this case and will not be repeated again.

For example, as shown in FIG. 7A, except for shift register units in the last three stages, a reset terminal RST of each of the shift register units in remaining stages is connected to a first output terminal OUT1 of a next stage shift register unit which is away from the reset terminal RST by two stages, that is, a reset terminal RST of a q1-th stage shift register unit is connected to a first output terminal OUT1 of a (q1+3)-th stage shift register unit. Except for a first stage shift register unit, a second stage shift register unit and a third stage shift register unit, a shift input terminal INT1 of each of the shift register units in remaining stages is connected to the first output terminal OUT1 of a previous stage shift register unit which is away from the shift input terminal INT1 by two stages, that is, a shift input terminal INT1 of a q2-th stage shift register unit is connected to a first output terminal OUT1 of a (q2−3)-th stage shift register unit. For example, q1 and q2 are both integers, and in a case where the gate drive circuit includes 2N shift register units, 1≤q1≤2N−3, 4≤q2≤2N.

For example, a shift input terminal INT1 of the first stage shift register unit, a shift input terminal INT1 of the second stage shift register unit and a shift input terminal INT1 of the third stage shift register unit may be configured to receive a trigger signal STV, and reset terminals RST of the shift register units in the last three stages may be configured to receive a reset signal RST. The trigger signal STV and the reset signal RST are not shown in FIG. 7A for the sake of brevity.

For example, the gate drive circuit further includes a first voltage line VGH1 and a second voltage line VGL1. For example, the first voltage line VGH1 is connected to the first voltage terminal VGH and is configured to provide a first voltage; and the second voltage line VGL1 is connected to the second voltage terminal VGL and is configured to provide the second voltage.

For example, as shown in FIG. 7A, the gate drive circuit 10 may further include a timing controller 300. For example, the timing controller 300 may be configured to be connected to the first clock signal line CLK1, the second clock signal line CLK2, the third clock signal line CLK3, the fourth clock signal line CLK4, the fifth clock signal line CLK5, and the sixth clock signal line CLK6, to provide the clock signals to each shift register unit; and the gate drive circuit 10 may also be configured to be connected to the first voltage line VGH1 and the second voltage line VGL1 to respectively supply the first voltage and the second voltage to each shift register unit and the output control circuit 100. For example, the timing controller 300 may also be configured to provide the trigger signal STV and the reset signal RESET.

Figure 7B:
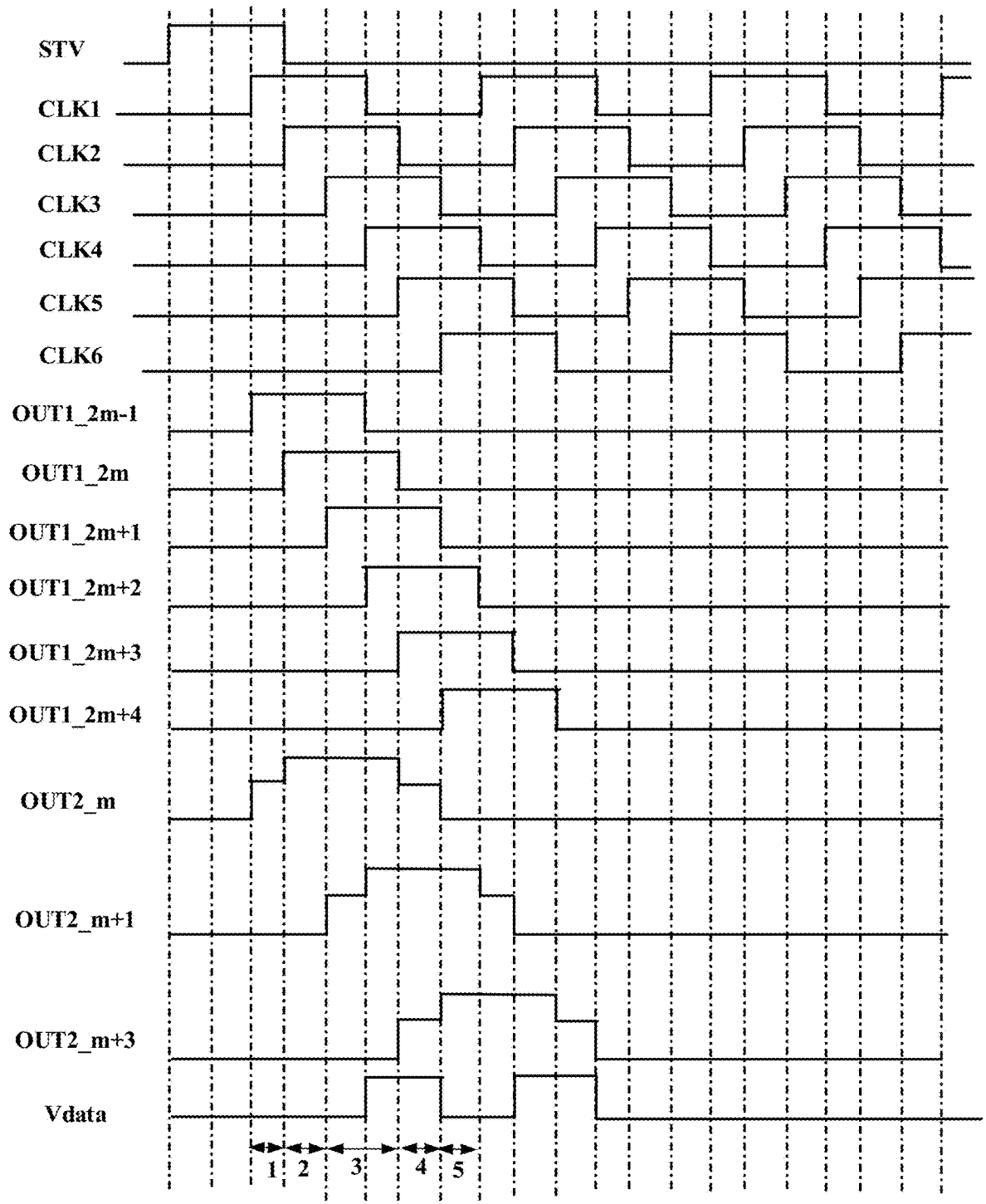
FIG. 7B is a timing diagram of signals corresponding to the gate drive circuit as shown in FIG. 7A in operation.

For example, a timing of the clock signals provided by the first clock signal line CLK1, the second clock signal line CLK2, the third clock signal line CLK3, the fourth clock signal line CLK4, the fifth clock signal line CLK5, and the sixth clock signal line CLK6 may adopt a signal timing shown in FIG. 7B to achieve a function that the gate drive circuit 10 output the gate scan signals line by line.

An operation principle of the gate drive circuit 10 shown in FIG. 7A can be described below with reference to the signal timing diagram shown in FIG. 7B. The operation principle of the gate drive circuit shown in FIG. 7A is as follows:

In a first phase 1, the first clock signal line CLK1 provides a high level signal. Because the first clock signal terminal CLKA of the (2m−1)-th stage shift register unit 200 is connected to the first clock signal line CLK1, in the first phase 1, the high level signal input by the first clock signal terminal CLKA is output to the first output terminal OUT1_2m−1 of the (2m−1)-th stage shift register unit 200 as the pulse level of the scan pulse signal output by the (2m−1)-th stage shift register unit; and because the gate electrode of the first transistor T1 in the m-th stage output control circuit 100 is connected to the first output terminal OUT1_2m−1 of the (2m−1)-th stage shift register unit 200, therefore, the first transistor T1 is turned on in response to the pulse level of the scan pulse signal output by the (2m−1)-th stage shift register unit, so that the first voltage terminal VGH is connected to the second electrode of the first capacitor C1 and charges the first capacitor C1, and at the same time, the m-th stage second output terminal OUT2_m outputs the first voltage as the output pulse signal, in this case the level of the output pulse signal is the second level, and the second level is the level of the first voltage, i.e. VGH.

It should be noted that a high level and a low level of the potential in the signal timing diagram shown in FIG. 7B are only schematic and does not represent the true potential value or relative proportion. Corresponding to the above example, the high level signal corresponds a turned-on signal of the N-type transistor, while the low level signal corresponds to a turned-off signal of the N-type transistor. The second level may be the second pulse level of the output pulse signal described above.

For example, in the first phase 1, a level of the first electrode of the first capacitor C1 is a horizontal level.

In a second phase 2, the first clock signal line CLK1 provides a high level signal, and the second clock signal line CLK2 provides a high level signal. Because the first clock signal terminal CLKA of the (2m−1)-th stage shift register unit 200 is connected to the first clock signal line CLK1, and the first clock signal terminal CLKA of the 2m-th stage shift register unit 200 is connected to the second clock signal line CLK2, in the second phase 2, the scan pulse signal output by the (2m−1)-th stage shift register unit and the scan pulse signal output by the 2m-th stage shift register unit are both at a pulse level. Because the gate electrode of the first transistor T1 in the m-th stage output control circuit 100 is connected to the first output terminal OUT1_2m−1 of the (2m−1)-th stage shift register unit 200, in the second phase 2, the first transistor T1 continues to be turned on in response to the pulse level of the scan pulse signal of the (2m−1)-th stage shift register unit, so that the first voltage terminal VGH is connected to the second electrode of the first capacitor C1. Because the first electrode of the first capacitor C1 is connected to the first output terminal OUT1_2m of the 2m-th stage shift register unit 200, therefore the level of the first electrode of the first capacitor C1 becomes a pulse level in the second phase 2. In the second phase 2, because the first electrode of the first capacitor C1 (i.e., connected to the first output terminal OUT1_2m of the 2m-th stage shift register unit 200) is changed from the horizontal level in the first phase 1 to the pulse level, and a voltage of the second electrode of the first capacitor C1 is bootstrapped according to the characteristic that the voltage across the capacitor cannot change abruptly, thus, in the second phase 2, a level of the second electrode of the first capacitor C1 becomes a first level, i.e., the output pulse signal output by the m-th stage second output terminal OUT2_m is at the first level, i.e., VGH+VCLK. For example, the first level may be the first pulse level of the output pulse signal described above. Because the gate electrode of the first transistor T1 in the m-th stage output control circuit 100 is connected to the first output terminal OUT1_2m−1 of the (2m−1)-th stage shift register unit 200, the pulse level of the scan pulse signal of the (2m−1)-th stage shift register unit continues to be input to the gate electrode of the first transistor T1 in the second phase 2. That is, the level of the gate electrode of the first transistor T1 is the pulse level of the scan pulse signal of the (2m−1)-th stage shift register unit, that is, the level of the gate electrode of the first transistor T1 is VCLK. However, because the second electrode (i.e., the source electrode) of the first transistor T1 is connected to the second electrode of the first capacitor C1, the level of the second electrode of the first transistor T1 becomes the first level. At this time, the gate-source voltage between the gate electrode and the source electrode of the first transistor T1 is −VGH (VCLK−VGH−VCLK), thereby, the first transistor T1 is turned off, so that the level of the second electrode of the first capacitor C1 can be maintained at the first level.

In a third phase 3, the second clock signal line CLK2 continues to provide a high level signal, and the third clock signal line CLK3 provides a high level signal. Because the first clock signal terminal CLKA of the 2m-th stage shift register unit 200 is connected to the second clock signal line CLK2, and the first clock signal terminal CLKA of the (2m+1)-th stage shift register unit 200 is connected to the third clock signal line CLK3, so in the third phase 3, the scan pulse signal output by the 2m-th stage shift register unit and the scan pulse signal output by the (2m+1)-th stage shift register unit are both at a pulse level; and because the first electrode of the first capacitor C1 is connected to the first output terminal OUT1_2m of the 2m-th stage shift register unit 200, and the gate electrode of the second transistor T2 in the m-th stage output control circuit 100 is connected to the first output terminal OUT1_2m+1 of the (2m+1)-th stage shift register unit 200, the level of the first electrode of the first capacitor C1 remains at the pulse level of the scan pulse signal output by the 2m-th stage shift register unit in the third phase 3, that is, the first electrode of the first capacitor C1 (i.e., connected to the first output terminal OUT1_2m of the 2m-th stage shift register unit 200) still maintains at the pulse level in the second phase 2. The scan pulse signal of the (2m+1)-th stage shift register unit is transmitted to the gate electrode of the second transistor T2, that is, the level of the gate electrode of the second transistor T2 is the pulse level of the scan pulse signal of the (2m+1)-th stage shift register unit, that is, the level of the gate electrode of the second transistor T2 is VCLK. However, because the second electrode (i.e., the source electrode) of the second transistor T2 is connected to the second electrode of the first capacitor C1, thus, the level of the second electrode of the second transistor T2 is the first level. In this case, the gate-source voltage between the gate electrode and the source electrode of the second transistor T2 is −VGH (VCLK−VGH−VCLK), thereby the second transistor T2 is turned off, so that the level of the second electrode of the first capacitor C1 can be maintained at the first level. Therefore, in the third stage 3, the output pulse signal output by the m-th stage second output terminal OUT2_m is still at the first level, i.e., VGH+VCLK. Therefore, the level of the output pulse signal output by the m-th stage second output terminal OUT2_m in the second stage 2 is the same as the level of the output pulse signal output by the m-th stage second output terminal OUT2_m in the third stage 3, that is, the gate scan signal does not change.

In a fourth phase 4, the second clock signal line CLK2 provides a low level signal, and the third clock signal line CLK3 continues to provide a high level signal. Because the first clock signal terminal CLKA of the 2m-th stage shift register unit 200 is connected to the second clock signal line CLK2, and the first clock signal terminal CLKA of the (2m+1)-th stage shift register unit 200 is connected to the third clock signal line CLK3, in the fourth phase 4, the scan pulse signal output by the 2m-th stage shift register unit is at a horizontal level, and the scan pulse signal output by the (2m+1)-th stage shift register unit is at a pulse level; and because the first electrode of the first capacitor C1 is connected to the first output terminal OUT1_2m of the 2m-th stage shift register unit 200, and the gate electrode of the second transistor T2 in the m-th stage output control circuit 100 is connected to the first output terminal OUT1_2m+1 of the (2m+1)-th stage shift register unit 200, the level of the first electrode (i.e., connected to the first output terminal OUT1_2m of the 2m-th stage shift register unit 200) of the first capacitor C1 changes to a horizontal level in the fourth phase 4, i.e., the first electrode of the first capacitor C1 changes from the pulse level in the second stage 2 and the third stage 3 to a horizontal level. According to the characteristic that the voltage across the capacitor cannot suddenly change, the voltage of the second electrode of the first capacitor C1 is restored to the first voltage. Therefore, in the fourth phase 4, the output pulse signal output by the m-th stage second output terminal OUT2_m is the first voltage, that is, the output pulse signal output by the m-th stage second output terminal OUT2_m is at a second level. The scan pulse signal output by the (2m+1)-th stage shift register unit is transmitted to the gate electrode of the second transistor T2, and the scan pulse signal output by the (2m+1)-th stage shift register unit is still at a pulse level, that is, the level of the gate electrode of the second transistor T2 is VCLK. However, because the second electrode (i.e., the source electrode) of the second transistor T2 is connected to the second electrode of the first capacitor C1, the level of the second electrode of the second transistor T2 becomes the second level, i.e., at this time, the level of the second electrode of the second transistor T2 is VGH, the gate-source voltage between the gate electrode and the source electrode of the second transistor T2 is VCLK−VGH, and the second transistor T2 can be turned on, so that the first voltage terminal VGH is connected to the second electrode of the first capacitor C1, thereby ensuring that the level of the second electrode of the first capacitor C1 is maintained at a level of the first voltage.

In a fifth phase 5, the third clock signal line CLK3 provides a low level signal and the sixth clock signal line CLK6 provides a high level signal. Because the first clock signal terminal CLKA of the (2m+1)-th stage shift register unit 200 is connected to the third clock signal line CLK3, and the first clock signal terminal CLKA of the (2m+4)-th stage shift register unit 200 is connected to the sixth clock signal line CLK6, therefore, in the fifth phase 5, the scan pulse signal output by the (2m+1)-th stage shift register unit is at a horizontal level, and the scan pulse signal output by the (2m+4)-th stage shift register unit is at a pulse level; and because the gate electrode of the third transistor T3 in the m-th stage output control circuit 100 is connected to the first output terminal OUT1_2m+4 of the (2m+4)-th stage shift register unit 200, in the fifth phase 5, the third transistor T3 is turned on in response to the pulse level of the scan pulse signal output by the (2m+4)-th stage shift register unit, so that the second voltage terminal VGL is connected to the second electrode of the first capacitor C1, thereby discharging the voltage of the second electrode of the first capacitor C1 to the second voltage VGL. Therefore, in the fifth phase 5, the m-th stage second output terminal OUT2_m outputs the second voltage as the output pulse signal, in this case, the level of the output pulse signal is a third level, and the third level is the level of the second voltage, i.e., VGL. The third level may be the horizontal level of the output pulse signal described above.

For example, in the fourth phase 4 and the fifth phase 5, the first clock signal line CLK1 provides a low level signal, so the first transistor T1 continues to be turned off. In the fifth phase 5, the second clock signal line CLK2 provides a low level signal.

For example, in the first phase 1, the output pulse signal output by the m-th stage second output terminal OUT2_m is at the second level. In the second phase 2, the output pulse signal output by the m-th stage second output terminal OUT2_m is at the first level, and the output pulse signal can be output to a pixel circuit connected thereto to implement pre-charging the pixel circuit, i.e., a data writing transistor in the pixel circuit is turned on. Because no data signal is provided for the pixel circuit at this time, charging operation is not performed on the pixel circuit at this time. In the third phase 3, the output pulse signal output by the m-th stage second output terminal OUT2_m is at the first level, in the fourth phase 4, the output pulse signal output by the m-th stage second output terminal OUT2_m is at the second level, and at the same time, in the third stage 3 and the fourth stage 4, a data signal Vdata is supplied to the pixel circuit connected with the m-th stage second output terminal OUT2_m, thereby charging the pixel circuit connected with the m-th stage second output terminal OUT2_m. Because the pulse level of the output pulse signal changes in a process from the third phase 3 to the fourth phase 4, the pulling of the data signal Vdata by the output pulse signal can be reduced or avoided, thereby implementing chamfering and improving the display quality of the display panel.

It should be noted that a high level and a low level of the potential of the data signal Vdata in the timing diagram shown in FIG. 7B are only schematic, and are expressed in the form of a high level and a low level in order to distinguish the data signal in various stages, and do not represent a true potential value or a relative proportion.

Figure 8A:
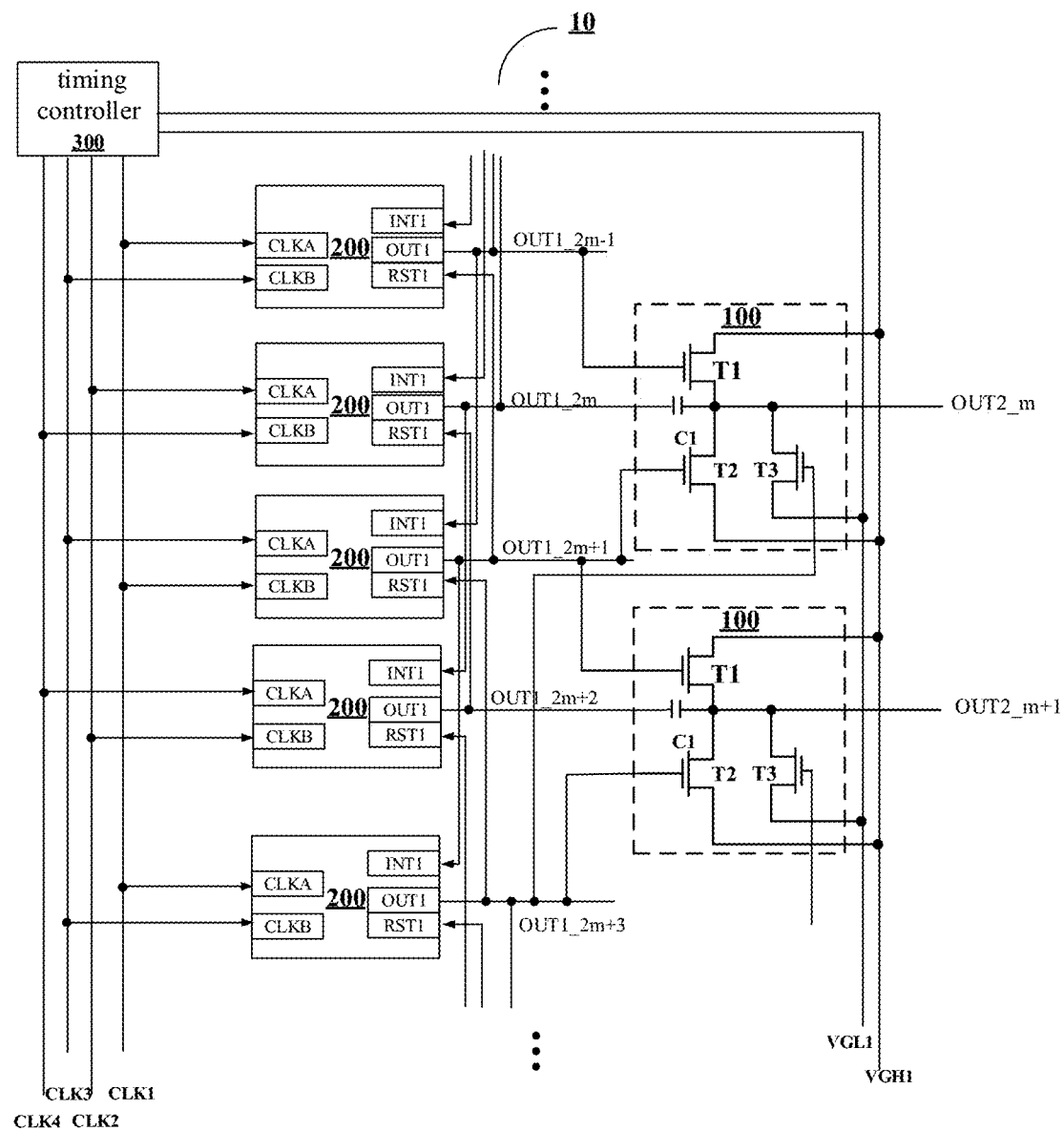
FIG. 8A is a schematic diagram of another gate drive circuit provided by at least one embodiment of the present disclosure.

FIG. 8A is a schematic diagram of another gate drive circuit provided by an embodiment of the present disclosure. A structure of the gate drive circuit shown in FIG. 8A is similar to the structure of the gate drive circuit shown in FIG. 7A, and similar parts will not be described again, but the difference is that: the gate drive circuit 10 includes a first clock signal line CLK1, a second clock signal line CLK2, a third clock signal line CLK3, and a fourth clock signal line CLK4, and the input terminal INT (i.e., the first electrode of the first capacitor C1) of the m-th stage output control circuit 100 of the gate drive circuit 10 is connected to the first output terminal OUT1_2m of the 2m-th stage shift register unit, the first control terminal Ctr1 (i.e., the gate electrode of the first transistor T1) of the m-th stage output control circuit 100 is connected to the first output terminal OUT1_2m−1 of the (2m−1)-th stage shift register unit, the second control terminal Ctr2 (i.e., the gate electrode of the second transistor T2) of the m-th stage output control circuit 100 is connected to the first output terminal OUT1_2m+1 of the (2m+1)-th stage shift register unit, and the third control terminal Ctr3 (i.e., the gate electrode of the third transistor T3) of the m-th stage output control circuit 100 is connected to a first output terminal OUT1_2m+3 of a (2m+3)-th stage shift register unit.

It should be noted that if the output control circuit shown in FIG. 4B or FIG. 4C is adopted, the gate electrode of the second transistor T2 and the gate electrode of the third transistor T3 are both connected to the first output terminal OUT1_2m+1 of the (2m+1)-th stage shift register unit.

For example, as shown in FIG. 8A, the first clock signal line CLK1 is connected to, for example, a first clock signal terminal CLKA of a (4n−3)-th stage (n is an integer greater than 0) shift register unit and a second clock signal terminal CLKB of a (4n−1)-th stage shift register unit; the second clock signal line CLK2 is connected to, for example, a first clock signal terminal CLKA of a (4n−2)-th stage shift register unit and a second clock signal terminal CLKB of a 4n-th stage shift register unit; the third clock signal line CLK3 is connected to, for example, a first clock signal terminal CLKA of the (4n−1)-th stage shift register unit and a second clock signal terminal CLK2 of the (4n−3) stage shift register unit; and the fourth clock signal line CLK4 is connected to, for example, a first clock signal terminal CLKA of the 4n-th stage shift register unit and a second clock signal terminal CLKB of the (4n−2)-th stage shift register unit. It should be noted that the embodiments of the present disclosure may also include other connection methods, and the embodiments of the present disclosure are not limited thereto.

For example, as shown in FIG. 8A, except for shift register units in the last two stages, a reset terminal RST of each of the shift register units in remaining stages is connected to the first output terminal OUT1 of a next stage shift register unit which is away from the reset terminal RST by one stage, that is, a reset terminal RST of a q3-th stage shift register unit is connected to a first output terminal OUT1 of a (q3+2)-th stage shift register unit. Except for a first stage shift register unit and a second stage shift register unit, a shift input terminal INT1 of each of the shift register units in remaining stages is connected to a first output terminal OUT1 of a previous stage shift register unit which is away from the shift input terminal INT1 by one stage, that is, a shift input terminal INT1 of a q4-th stage shift register unit is connected to a first output terminal OUT1 of a (q4−2)-th stage shift register unit. For example, q3 and q4 are both integers, and when the gate drive circuit includes 2N shift register units, $1 \leq q3 \leq 2N-2$, $3 \leq q4 \leq 2N$.

For example, a shift input terminal INT1 of the first stage shift register unit and a shift input terminal INT1 of the second stage shift register unit may be both configured to receive a trigger signal STV, and the reset terminals RST of the shift register units in the last two stages may be both configured to receive a reset signal RST, and the trigger signal STV and the reset signal RST are not shown in FIG. 8A for the sake of brevity.

Figure 8B:
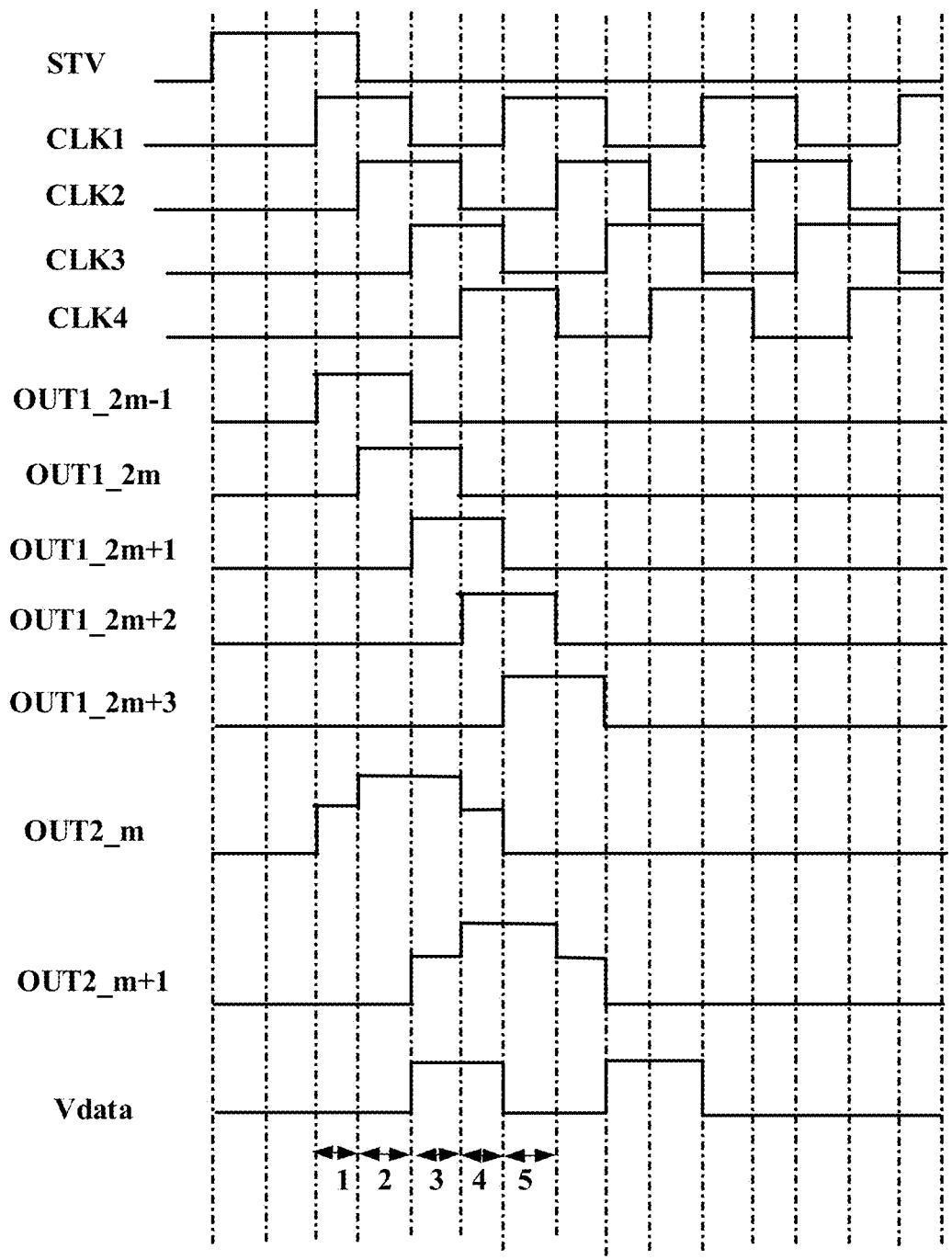
FIG. 8B is a timing diagram of signals corresponding to the gate drive circuit as shown in FIG. 8A in operation.

For example, a timing of the clock signals provided by the first clock signal line CLK1, the second clock signal line CLK2, the third clock signal line CLK3, and the fourth clock signal line CLK4 may adopt a signal timing shown in FIG. 8B to achieve a function that the gate drive circuit 10 output a gate scan signal line by line.

An operation principle of the gate drive circuit 10 shown in FIG. 8A can be described below with reference to the signal timing diagram shown in FIG. 8B. Because the operation principle of the gate drive circuit shown in FIG. 8A is similar to the operation principle of the gate drive circuit shown in FIG. 7A, and similar parts are not repeated herein, only the fifth phase is briefly described below. For example, in the example shown in FIG. 8A, i is equal to 3.

In the fifth phase 5, the third clock signal line CLK3 provides a low level signal, and the first clock signal line CLK1 provides a high level signal. Because the first clock signal terminal CLKA of the (2m+1)-th stage shift register unit 200 is connected to the third clock signal line CLK3, the first clock signal terminal CLKA of the (2m+3)-th stage shift register unit 200 is connected to the first clock signal line CLK1, in the fifth phase 5, the scan pulse signal output by the (2m+1)-th stage shift register unit is at a horizontal level, and the scan pulse signal output by the (2m+3)-th stage shift register unit is at a pulse level; and because the gate electrode of the third transistor T3 in the m-th stage output control circuit 100 is connected to the first output terminal OUT1_2m+3 of the (2m+3)-th stage shift register unit 200, in the fifth phase 5, the third transistor T3 is turned on in response to the pulse level of the scan pulse signal output by the (2m+3)-th stage shift register unit, thus the second voltage terminal VGL is connected to the second electrode of the first capacitor C1, so that the voltage of the second electrode of the first capacitor C1 is discharged to the second voltage VGL. Therefore, in the fifth phase 5, the m-th stage second output terminal OUT2_m outputs a second voltage as the output pulse signal, in this case, the level of the output pulse signal is a third level, and the third level is the level of the second voltage, that is, VGL.

It should be noted that the gate drive circuit may further include eight, ten or twelve clock signal lines, and more. The number of clock signal lines is determined on a specific situation, and the embodiments of the present disclosure are not limited to this case here.

It should be noted that in a case where the gate drive circuit 10 provided in the embodiment of the present disclosure is used to drive a display panel, the gate drive circuit 10 may be disposed on one side of the display panel. For example, the display panel includes gate lines in a plurality of rows, and the second output terminals of respective output control circuits in the gate drive circuit 10 may be configured to be sequentially connected to the gate lines in the plurality of rows for outputting the output pulse signals as gate scan signals. It should be noted that the gate drive circuits 10 may be provided on both sides of the display panel to achieve bilateral driving, and the embodiment of the present disclosure does not limit the arrangement of the gate drive circuits 10.

Figure 9:
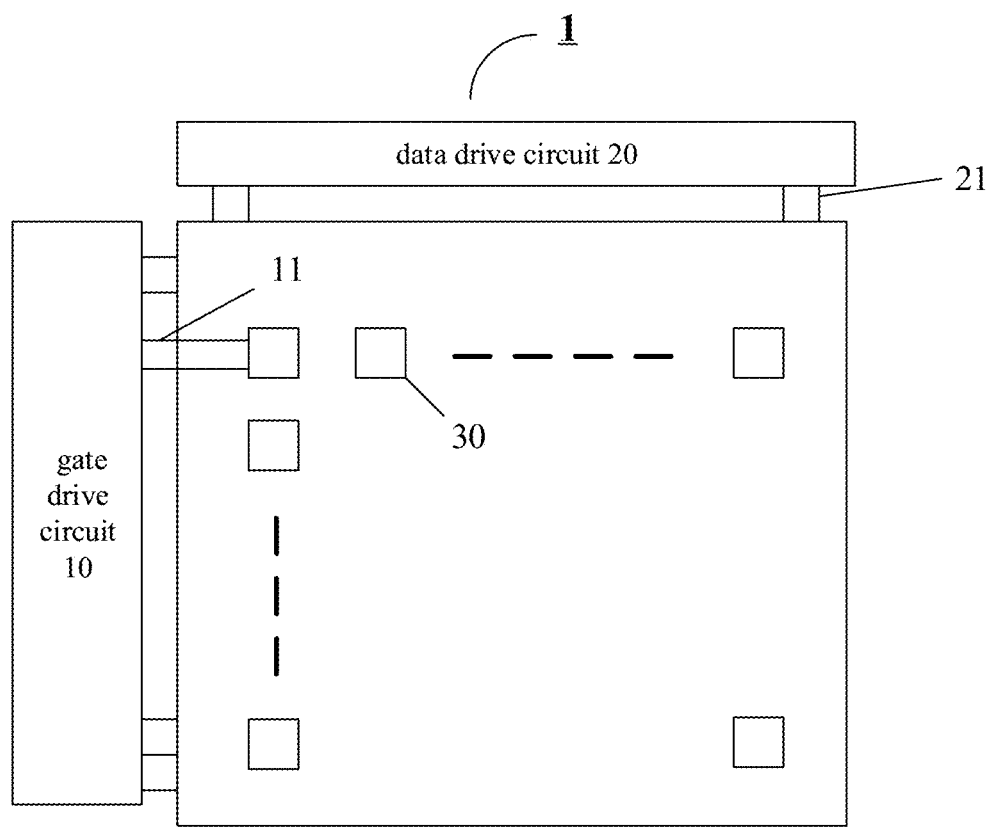
FIG. 9 is a schematic diagram of a display device provided by at least one embodiment of the present disclosure.

An embodiment of the present disclosure also provides a display device 1. As shown in FIG. 9, the display device 1 includes the gate drive circuit 10 provided in the embodiments of the present disclosure. The display device 1 includes a pixel array including a plurality of pixel units 30. For example, the display device 1 may further include a data drive circuit 20. The data drive circuit 20 is configured to provide data signals to the pixel array; and the gate drive circuit 10 is configured to provide gate scan signals to the pixel array. The data drive circuit 20 is electrically connected to the pixel units 30 through data lines 21, and the gate drive circuit 10 is electrically connected to the pixel units 30 through gate lines 11.

It should be noted that the display device 1 in this embodiment can be any product or component with a display function such as a liquid crystal panel, a liquid crystal television, a display, an OLED panel, an OLED television, an electronic paper display device, a mobile phone, a tablet computer, a notebook computer, a digital photo frame, a navigator, and the like. The display device 1 may also include other conventional components such as a display panel, and the embodiments of the present disclosure are not limited to this case.

Technical effects of the display device 1 provided by the embodiment of the present disclosure may be referred to the corresponding description of the gate drive circuit 10 in the above embodiment, and will not be described herein again.

It should be noted that an entire structure of the display device 1 is not given for clarity and conciseness. In order to achieve necessary functions of the display device, those skilled in the art can set other structures not shown according to specific application scenarios, and embodiments of the present disclosure are not limited to this case.

An embodiment of the present disclosure also provides a method for driving a gate drive circuit, such as a gate drive circuit for a display device, and the method may include the following operations.

In a first phase, the scan pulse signal of the (2m−1)-th stage first output terminal OUT1_2m−1 is at a pulse level, and a pulse level of the output pulse signal output by the second output terminal OUT2_$m$ of the m-th stage output control circuit is a second level.

In a second phase, the scan pulse signal of the (2m−1)-th stage first output terminal OUT1_−2m−1 and the scan pulse signal of the 2m-th stage first output terminal OUT1_2m are at a pulse level, and the pulse level of the output pulse signal output by the second output terminal OUT2_$m$ of the m-th stage output control circuit is a first level.

In a third phase, the scan pulse signal of the 2m-th stage first output terminal OUT1_2m and the scan pulse signal of the (2m+1)-th stage first output terminal OUT1_2m+1 are at a pulse level, and the pulse level of the output pulse signal output by the second output terminal OUT2_$m$ of the m-th stage output control circuit is the first level.

In a fourth phase, the scan pulse signal of the 2m-th stage first output terminal OUT1_2m is at a horizontal level, the scan pulse signal of the (2m+1)-th stage first output terminal OUT1_2m+1 is at a pulse level, and the pulse level of the output pulse signal output by the second output terminal OUT2_$m$ of the m-th stage output control circuit is the second level.

In a fifth phase, the scan pulse signal of the (2m+1)-th stage first output terminal OUT1_−2m+1 is a horizontal level, and the pulse level of the output pulse signal output by the second output terminal OUT_m of the m-th stage output control circuit is a third level.

For example, the first level is greater than the second level, and the second level is greater than the third level.

Technical effects of the method for driving the gate drive circuit 10 provided by the embodiment of the present disclosure can be referred to the corresponding description of the gate drive circuit 10 in the above embodiment, and will not be repeated herein.

The following should be noted:

(1) The accompanying drawings involve only the structure(s) in connection with the embodiment(s) of the present disclosure, and other structure(s) can be referred to common design(s).

(2) The embodiments and features in the embodiments of the present disclosure may be combined in case of no conflict to obtain new embodiments.

The above descriptions merely are exemplary embodiments of the disclosure, and are not intended to limit the scope of the disclosure, and the scope of the disclosure is determined by the appended claims.

What is claimed is:

1. A gate drive circuit, comprising a scan signal generation circuit and output control circuits in N stages,
   wherein the scan signal generation circuit comprises first output terminals in 2N stages, and is configured to output scan pulse signals in an order at the first output terminals in 2N stages;
   each of the output control circuits in N stages comprises an input terminal, a first control terminal, a second control terminal, a second output terminal, and a bootstrap circuit connected to the input terminal and the second output terminal, and is configured to control the bootstrap circuit, under control of a first control signal received by the first control terminal, an input signal received by the input terminal, and a second control signal received by the second control terminal, to output an output pulse signal with different pulse levels at the second output terminal;
   a first control terminal of an m-th stage output control circuit of the output control circuits in N stages is connected to a (2m−1)-th stage first output terminal of the first output terminals in 2N stages to receive a scan pulse signal of the (2m−1)-th stage first output terminal as the first control signal, an input terminal of the m-th stage output control circuit is connected to a 2m-th stage first output terminal of the first output terminals in 2N stages to receive a scan pulse signal of the 2m-th stage first output terminal as the input signal, and a second control terminal of the m-th stage output control circuit is connected to a (2m+1)-th stage first output terminal of the first output terminals in 2N stages to receive a scan pulse signal of the (2m+1)-th stage first output terminal as the second control signal; and
   N is an integer greater than 2, and m is an integer greater than or equal to 1 and less than N.

2. The gate drive circuit according to claim 1,
   wherein each of the output control circuits in N stages further comprises a third control terminal and is further configured to control the bootstrap circuit under control of a third control signal received by the third control terminal;
   a third control terminal of the m-th stage output control circuit is connected to a (2m+i)-th stage first output terminal of the first output terminals in 2N stages to receive a scan pulse signal of the (2m+i)-th stage first output terminal as the third control signal; and
   i is an integer greater than 2.

3. The gate drive circuit according to claim 2, wherein a pulse of the scan pulse signal output from the (2m+1)-th stage first output terminal is temporally continuous with a pulse of the scan pulse signal output from the (2m+i)-th stage first output terminal.

4. The gate drive circuit according to claim 2,
   wherein each of the output control circuits in N stages further comprises a first output control sub-circuit, a second output control sub-circuit and a third output control sub-circuit;
   the first output control sub-circuit is connected to the first control terminal, a first voltage terminal and the second output terminal, and is configured to control the bootstrap circuit under control of the first control signal received by the first control terminal;
   the second output control sub-circuit is connected to the second control terminal, the first voltage terminal and the second output terminal, and is configured to control the bootstrap circuit under control of the second control signal received by the second control terminal; and
   the third output control sub-circuit is connected to the third control terminal, a second voltage terminal and the second output terminal, and is configured to control the bootstrap circuit under control of the third control signal received by the third control terminal.

5. The gate drive circuit according to claim 4,
   wherein the first output control sub-circuit comprises a first transistor, a gate electrode of the first transistor is connected to the first control terminal to receive the first control signal, a first electrode of the first transistor is connected to the first voltage terminal to receive a first voltage, and a second electrode of the first transistor is connected to the second output terminal;
   the second output control sub-circuit comprises a second transistor, a gate electrode of the second transistor is connected to the second control terminal to receive the second control signal, a first electrode of the second transistor is connected to the first voltage terminal to receive the first voltage, and a second electrode of the second transistor is connected to the second output terminal; and the third output control sub-circuit comprises a third transistor, a gate electrode of the third transistor is connected to the third control terminal to receive the third control signal, a first electrode of the third transistor is connected to the second voltage terminal to receive a second voltage, and a second electrode of the third transistor is connected to the second output terminal.

6. The gate drive circuit according to claim 5, wherein a type of the first transistor is identical to a type of the second transistor.

7. The gate drive circuit according to claim 1,
wherein each of the output control circuits in N stages further comprises a first output control sub-circuit and a second output control sub-circuit;
the first output control sub-circuit is connected to the first control terminal, a first voltage terminal and the second output terminal, and is configured to control the bootstrap circuit under control of the first control signal received by the first control terminal; and
the second output control sub-circuit is connected to the second control terminal, the first voltage terminal, and the second output terminal, and is configured to control the bootstrap circuit under control of the second control signal received by the second control terminal.

8. The gate drive circuit according to claim 7, wherein each of the output control circuits in N stages further comprises a third output control sub-circuit; and
the third output control sub-circuit is connected to the second control terminal, a second voltage terminal and the second output terminal, and is configured to control the bootstrap circuit under control of the second control signal received by the second control terminal.

9. The gate drive circuit according to claim 8,
wherein the first output control sub-circuit comprises a first transistor, a gate electrode of the first transistor is connected to the first control terminal to receive the first control signal, a first electrode of the first transistor is connected to the first voltage terminal to receive a first voltage, and a second electrode of the first transistor is connected to the second output terminal;
the second output control sub-circuit comprises a second transistor, a gate electrode of the second transistor is connected to the second control terminal to receive the second control signal, a first electrode of the second transistor is connected to the first voltage terminal to receive the first voltage, and a second electrode of the second transistor is connected to the second output terminal;
the third output control sub-circuit comprises a third transistor, a gate electrode of the third transistor is connected to the second control terminal to receive the second control signal, a first electrode of the third transistor is connected to the second voltage terminal to receive a second voltage, and a second electrode of the third transistor is connected to the second output terminal; and
a type of the second transistor is different from a type of the third transistor.

10. The gate drive circuit according to claim 8,
wherein the first output control sub-circuit comprises a first transistor, a gate electrode of the first transistor is connected to the first control terminal to receive the first control signal, a first electrode of the first transistor is connected to the first voltage terminal to receive a first voltage, and a second electrode of the first transistor is connected to the second output terminal;
the second output control sub-circuit comprises a second transistor, a gate electrode of the second transistor is connected to the second control terminal to receive the second control signal, a first electrode of the second transistor is connected to the first voltage terminal to receive the first voltage, and a second electrode of the second transistor is connected to the second output terminal;
the third output control sub-circuit comprises a third transistor and an inverter, a gate electrode of the third transistor is connected to the inverter, a first electrode of the third transistor is connected to the second voltage terminal to receive a second voltage, and a second electrode of the third transistor is connected to the second output terminal;
the inverter is connected to the second control terminal and the gate electrode of the third transistor, and is configured to invert and output a level of the second control signal received by the second control terminal to the gate electrode of the third transistor; and
a type of the second transistor is identical to a type of the third transistor.

11. The gate drive circuit according to claim 1, wherein the bootstrap circuit comprises a first capacitor; and
a first electrode of the first capacitor is connected to the input terminal to receive the input signal, and a second electrode of the first capacitor is connected to the second output terminal.

12. The gate drive circuit according to claim 1, wherein the scan signal generation circuit comprises 2N cascaded shift register units, each of the 2N cascaded shift register units comprises one of the first output terminals in 2N stages.

13. The gate drive circuit according to claim 12, wherein each of the 2N cascaded shift register units is a shift register unit of a GOA type.

14. The gate drive circuit according to claim 4, further comprising a first voltage line and a second voltage line;
wherein the first voltage line is connected to the first voltage terminal and is configured to provide a first voltage; and
the second voltage line is connected to the second voltage terminal and is configured to provide a second voltage.

15. A display device, comprising a gate drive circuit,
wherein the gate drive circuit comprises a scan signal generation circuit and output control circuits in N stages,
the scan signal generation circuit comprises first output terminals in 2N stages, and is configured to output scan pulse signals in an order at the first output terminals in 2N stages;
each of the output control circuits in N stages comprises an input terminal, a first control terminal, a second control terminal, a second output terminal, and a bootstrap circuit connected to the input terminal and the second output terminal, and is configured to control the bootstrap circuit, under control of a first control signal received by the first control terminal, an input signal received by the input terminal, and a second control signal received by the second control terminal, to output an output pulse signal with different pulse levels at the second output terminal;

a first control terminal of an m-th stage output control circuit of the output control circuits in N stages is connected to a (2m−1)-th stage first output terminal of the first output terminals in 2N stages to receive a scan pulse signal of the (2m−1)-th stage first output terminal as the first control signal, an input terminal of the m-th stage output control circuit is connected to a 2m-th stage first output terminal of the first output terminals in 2N stages to receive a scan pulse signal of the 2m-th stage first output terminal as the input signal, and a second control terminal of the m-th stage output control circuit is connected to a (2m+1)-th stage first output terminal of the first output terminals in 2N stages to receive a scan pulse signal of the (2m+1)-th stage first output terminal as the second control signal; and N is an integer greater than 2, and m is an integer greater than or equal to 1 and less than N.

16. A method for driving a gate drive circuit according to claim 1, comprising:

in a first phase, the scan pulse signal of the (2m−1)-th stage first output terminal being at a pulse level, and a pulse level of the output pulse signal output by the second output terminal of the m-th stage output control circuit being a second level;

in a second phase, the scan pulse signal of the (2m−1)-th stage first output terminal and the scan pulse signal of the 2m-th stage first output terminal being at a pulse level, and the pulse level of the output pulse signal output by the second output terminal of the m-th stage output control circuit being a first level;

in a third phase, the scan pulse signal of the 2m-th stage first output terminal and the scan pulse signal of the (2m+1)-th stage first output terminal being at a pulse level, and the pulse level of the output pulse signal output by the second output terminal of the m-th stage output control circuit being the first level;

in a fourth phase, the scan pulse signal of the 2m-th stage first output terminal being at a horizontal level, the scan pulse signal of the (2m+1)-th stage first output terminal being at a pulse level, and the pulse level of the output pulse signal output by the second output terminal of the m-th stage output control circuit being the second level; and in a fifth phase, the scan pulse signal of the (2m+1)-th stage first output terminal being a horizontal level, and the pulse level of the output pulse signal output by the second output terminal of the m-th stage output control circuit being a third level.

17. The method for driving the gate drive circuit according to claim 16, wherein the first level is greater than the second level.

18. The method for driving the gate drive circuit according to claim 16, wherein the second level is greater than the third level.

19. The method for driving the gate drive circuit according to claim 17, wherein the second level is greater than the third level.

* * * * *